United States Patent
You et al.

(10) Patent No.: US 10,170,029 B2
(45) Date of Patent: Jan. 1, 2019

(54) DISPLAY DEVICE HAVING GATE DRIVING CIRCUIT AND DRIVING METHOD THEREOF

(71) Applicant: SAMSUNG DISPLAY CO., LTD., Yongin-si, Gyeonggi-do (KR)

(72) Inventors: Bonghyun You, Seongnam-si (KR); Seokha Hong, Yongin-si (KR); Soo-yeon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 304 days.

(21) Appl. No.: 15/139,196

(22) Filed: Apr. 26, 2016

(65) Prior Publication Data

US 2017/0069283 A1 Mar. 9, 2017

(30) Foreign Application Priority Data

Sep. 9, 2015 (KR) .......................... 10-2015-0127846

(51) Int. Cl.
*G09G 3/36* (2006.01)
*G09G 3/20* (2006.01)
*G11C 19/28* (2006.01)

(52) U.S. Cl.
CPC ......... *G09G 3/2022* (2013.01); *G09G 3/2092* (2013.01); *G11C 19/28* (2013.01); *G09G 2300/0426* (2013.01); *G09G 2310/0267* (2013.01); *G09G 2310/0286* (2013.01); *G09G 2310/08* (2013.01)

(58) Field of Classification Search
CPC ..................................................... G09G 3/2022
See application file for complete search history.

(56) References Cited

U.S. PATENT DOCUMENTS

| 6,462,723 B1 * | 10/2002 | Yamazaki ............ G09G 3/3648 257/365 |
| 7,834,676 B2 | 11/2010 | Lee et al. |
| 2006/0119560 A1 * | 6/2006 | Jeon ..................... G09G 3/3696 345/98 |
| 2006/0132218 A1 * | 6/2006 | Tschanz .................. G05F 3/205 327/534 |

(Continued)

FOREIGN PATENT DOCUMENTS

| KR | 10-0493275 B1 | 5/2005 |
| KR | 10-2016-0093810 | 8/2016 |

*Primary Examiner* — Dorothy Harris
(74) *Attorney, Agent, or Firm* — Lewis Roca Rothgerber Christie LLP

(57) ABSTRACT

A display device includes: a display panel; a voltage generator to output a gate on voltage to a voltage output terminal; a clock generator to receive the gate on voltage to generate at least one clock signal; a gate driving circuit including a plurality of driving stages to output gate signals to gate lines in response to the at least one clock signal, each of the driving stages including at least one transistor to adjust a threshold voltage based on a back bias control voltage; and a signal controller to detect a current variation of the voltage output terminal and including a back bias controller to search for the back bias control voltage to minimize a consumption current level of the voltage output terminal while changing the back bias control voltage from a default voltage level when the detected current variation is greater than a reference level.

20 Claims, 21 Drawing Sheets

(56) References Cited

U.S. PATENT DOCUMENTS

| | | | |
|---|---|---|---|
| 2006/0223201 A1* | 10/2006 | Liu | G01R 31/2642 438/10 |
| 2007/0164808 A1* | 7/2007 | Tschanz | H03K 19/00384 327/534 |
| 2011/0102409 A1* | 5/2011 | Hayakawa | H01L 27/1225 345/212 |
| 2014/0028659 A1* | 1/2014 | Yamazaki | G09G 3/36 345/213 |
| 2016/0225307 A1* | 8/2016 | Yoon | G09G 3/2092 |

* cited by examiner

DISPLAY DEVICE HAVING GATE DRIVING CIRCUIT AND DRIVING METHOD THEREOF

CROSS-REFERENCE TO RELATED APPLICATION

This U.S. non-provisional patent application claims priority to and the benefit of Korean Patent Application No. 10-2015-0127846, under 35 U.S.C. § 119, filed on Sep. 9, 2015, the entire content of which is hereby incorporated by reference herein.

BACKGROUND

1. Field

One or more aspects of example embodiments of the inventive concept relate to a display device including a gate driving circuit.

2. Description of the Related Art

A display device includes a plurality of gate lines, a plurality of data lines, and a plurality of pixels connected to the plurality of gate lines and the plurality of data lines. The display device includes a gate driving circuit to provide gate signals to the plurality of gate lines, and a data driving circuit to output data signals to the plurality of data lines.

The gate driving circuit includes a shift register including a plurality of driving stage circuits (hereinafter, referred to as driving stages). The plurality of driving stages output gate signals corresponding to the plurality of gate lines, respectively. Each of the plurality of driving stages includes a plurality of transistors that are electrically connected to each other.

The above information disclosed in this Background section is for enhancement of understanding of the background of the invention, and therefore, it may contain information that does not constitute prior art.

SUMMARY

One or more aspects of example embodiments of the present inventive concept are directed toward a display device including a gate driving circuit that is integrated with a display panel.

One or more aspects of example embodiments of the present inventive concept are directed toward a display device that is capable of improving reliability of a gate driving circuit.

According to an embodiment of the inventive concept, a display device includes: a display panel including a plurality of pixels respectively connected to a plurality of gate lines; a voltage generator configured to output a gate on voltage to a voltage output terminal; a clock generator configured to receive the gate on voltage to generate at least one clock signal; a gate driving circuit including a plurality of driving stages configured to output gate signals to the plurality of gate lines in response to the at least one clock signal; and a signal controller configured to detect a current variation of the voltage output terminal to output a back bias control voltage when the detected current variation is greater than a reference level, wherein each of the plurality of driving stages includes at least one transistor configured to adjust a threshold voltage based on the back bias control voltage, and wherein the signal controller includes a back bias controller configured to search for the back bias control voltage that is capable of minimizing a consumption current level of the voltage output terminal while changing the back bias control voltage by a set level from a default voltage level when the detected current variation is greater than the reference level.

In an embodiment, the back bias controller may include: a boundary searcher configured to search for first and second boundary voltages that are capable of minimizing the consumption current level of the voltage output terminal while changing the back bias control voltage by a first voltage level from the default voltage level when the detected current variation is greater than the reference level; a minimum current level searcher configured to search for first and second minimum current levels that are capable of minimizing the consumption current level of the voltage output terminal while changing the back bias control voltage by a second voltage level between the first and second boundary voltages; and a back bias control voltage setter configured to output a voltage corresponding to a relatively low current level of the first and second minimum current levels as the back bias control voltage.

In an embodiment, the first voltage level may be higher than the second voltage level.

In an embodiment, the clock generator may be configured to provide at least one low voltage to the gate driving circuit.

In an embodiment, the gate driving circuit may include: a back bias voltage signal line configured to transmit the back bias control voltage to each of the plurality of stages; a clock signal line configured to transmit the at least one clock signal to each of the plurality of stages; and a low voltage line configured to transmit the at least one low voltage to each of the plurality of stages.

In an embodiment, the plurality of stages may be configured to output the gate signals in response to the back bias control voltage, the at least one clock signal, and the at least one low voltage.

In an embodiment, a k-th stage (where k is natural number greater than 2) of the plurality of stages may include: a first output transistor including a control electrode configured to receive an output control signal from a first node, an input electrode configured to receive the at least one clock signal, and an output electrode configured to output a k-th gate signal; a second output transistor including a control electrode configured to receive the output control signal from the first node, an input electrode configured to receive the at least one clock signal, and an output electrode configured to output a k-th carry signal; and a control portion configured to output the output control signal to the first node in response to the at least one clock signal, to output a (k−1)-th carry signal outputted from a (k−1)-th stage, and to output a (k+1)-th carry signal outputted from a (k+1)-th stage.

In an embodiment, at least one of the first and second output transistors may include a four-terminal transistor including a first electrode, a second electrode, a gate electrode, and a back gate electrode connected to a source of the back bias control voltage.

In an embodiment, each of the plurality of driving stages may further include a back bias selection portion configured to provide the at least one clock signal to the back gate electrode of the four-terminal transistor when a gate signal having an activated level is outputted to a corresponding gate line, and configured to provide the back bias control voltage to the back gate electrode of the four-terminal transistor when the gate signal having an non-activated level is outputted.

In an embodiment, the back bias selection portion may include: a first control transistor including a first electrode connected to a source of the at least one clock signal, a second electrode connected to the back gate electrode of the four-terminal transistor, and a gate electrode connected to the first node; a second control transistor including a first electrode connected to the back gate electrode of the four-terminal transistor, a second electrode connected to the source of the back bias control voltage, and a gate electrode connected to a source of an inversion signal of the k-th carry signal; and a capacitor connected between the back gate electrode of the four-terminal transistor and a source of the at least one low voltage.

In an embodiment, the signal controller may be further configured to output a switching signal, and each of the plurality of driving stages may further include a back bias selection portion configured to provide the back bias control voltage to the back gate electrode of the four-terminal transistor when the switching signal is activated.

In an embodiment, the back bias selection portion may include: a control transistor including a first electrode connected to the source of the back bias control voltage, a second electrode connected to the back gate electrode of the four-terminal transistor, and a control electrode connected to a source of the switching signal; and a capacitor connected between the back gate electrode of the four-terminal transistor and the second electrode of the four-terminal transistor.

According to an embodiment of the inventive concept, a display device includes: a display panel including a plurality of pixels respectively connected to a plurality of gate lines; a voltage generator configured to output a gate on voltage to a voltage output terminal; a clock generator configured to receive the gate on voltage to generate at least one clock signal; a gate driving circuit including a plurality of driving stages configured to output gate signals to the plurality of gate lines in response to the at least one clock signal; and a signal controller configured to detect a current variation of the voltage output terminal to output a back bias control voltage when the detected current variation is greater than a reference level, wherein each of the plurality of driving stages includes: at least one transistor including a back gate electrode configured to adjust a threshold voltage according to the back bias control voltage provided to the back gate electrode; and a back bias selection portion configured to provide a first signal to the back gate electrode when a gate signal having an activated level is outputted to a corresponding gate line, and configured to provide the back bias control voltage to the back gate electrode when the gate signal having an non-activated level is outputted.

In an embodiment, the at least one transistor may include a four-terminal transistor including a first electrode, a second electrode, a gate electrode, and the back gate electrode.

In an embodiment, the back bias selection portion may include: a first control transistor including a first electrode connected to a source of the at least one clock signal, a second electrode connected to the back gate electrode of the at least one transistor, and a gate electrode connected to a first node; a second control transistor including a first electrode connected to the back gate electrode of the at least one transistor, a second electrode connected to a source of the back bias control voltage, and a gate electrode connected to a source of an inversion signal of a k-th carry signal; and a capacitor connected between the back gate electrode of the at least one transistor and a source of at least one low voltage.

In an embodiment, the signal controller may be further configured to output a switching signal, the back bias selection portion may be configured to provide the back bias control voltage to the back gate electrode of the at least one transistor when the switching signal is activated, and the back bias selection portion may include: a control transistor including a first electrode connected to a source of the back bias control voltage, a second electrode connected to the back gate electrode of the at least one transistor, and a control electrode connected to a source of the switching signal; and a capacitor connected between the back gate electrode of the at least one transistor and the second electrode of the at least one transistor.

According to an embodiment of the inventive concept, a method for driving a display device including a display panel including a plurality of pixels respectively connected to a plurality of gate lines, and a gate driving circuit including a plurality of driving stages configured to output gate signals to the plurality of gate lines, includes: generating a gate on voltage to output the gate on voltage to a voltage output terminal; driving the plurality of gate lines by utilizing the plurality of driving stages; detecting a current variation of the voltage output terminal; and outputting a back bias control voltage that is capable of minimizing a consumption current level of the voltage output terminal while changing the back bias control voltage by a set level from a default voltage level when the detected current variation is greater than a reference level, wherein each of the plurality of driving stages includes at least one transistor configured to adjust a threshold voltage according to the back bias control voltage.

In an embodiment, the outputting of the back bias control voltage may include: searching for first and second boundary voltages that are capable of minimizing consumption current level of the voltage output terminal while changing the back bias control voltage by a first voltage level from the default voltage level when the detected current variation is greater than the reference level; searching for first and second minimum current levels that are capable of minimizing the consumption current level of the voltage output terminal while changing the back bias control voltage by a second voltage level between the first and second boundary voltages; and outputting a voltage corresponding to a relatively low current level of the first and second minimum current levels as the back bias control voltage.

In an embodiment, the first voltage level may be higher than the second voltage level.

In an embodiment, the at least one transistor may include a four-terminal transistor including a first electrode, a second electrode, a gate electrode, and a back gate electrode connected to a source of the back bias control voltage.

BRIEF DESCRIPTION OF THE DRAWINGS

The above and other features and aspects of the inventive concept will be more clearly understood from the following detailed description taken in conjunction with the accompanying drawings, in which.

DETAILED DESCRIPTION

Hereinafter, exemplary embodiments of the inventive concept will be described in more detail with reference to the accompanying drawings.

Figure 1:
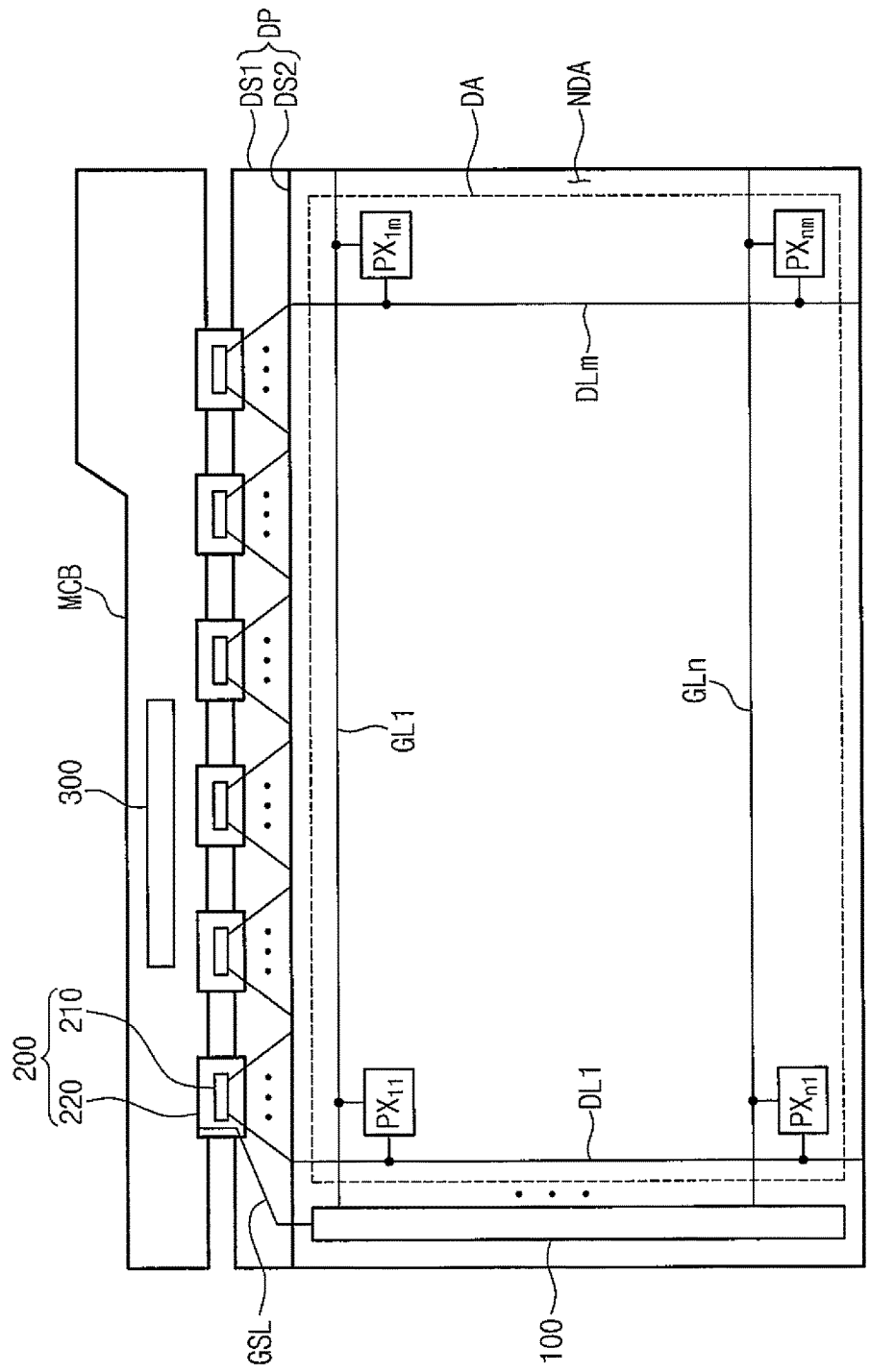
FIG. 1 is a plan view of a display device according to an embodiment of the inventive concept.
Figure 2:
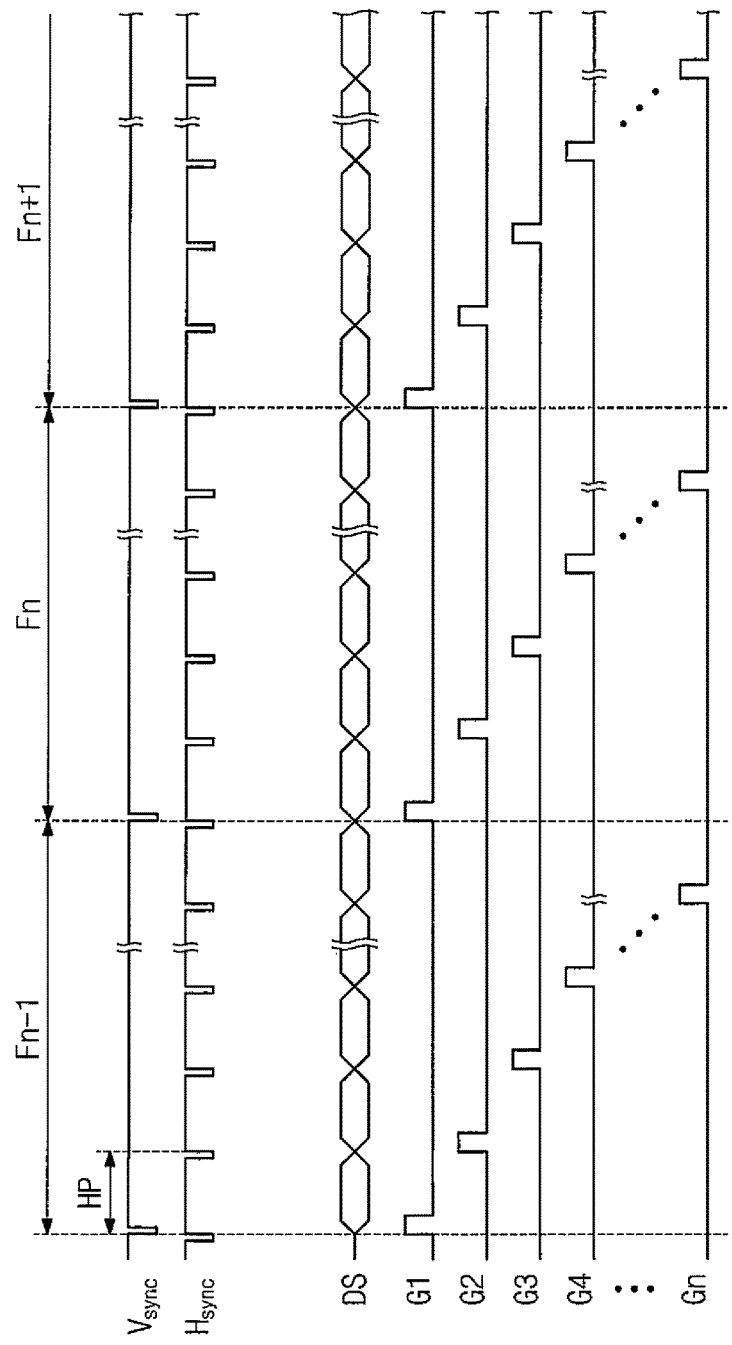
FIG. 2 is a timing diagram of signals of the display device according to an embodiment of the inventive concept.

FIG. 1 is a plan view of a display device according to an embodiment of the inventive concept. FIG. 2 is a timing diagram of signals of the display device according to an embodiment of the inventive concept.

Referring to FIGS. 1 and 2, a display device according to an embodiment of the inventive concept includes a display panel DP, a gate driving circuit 100, a data driving circuit 200, and a driving controller 300.

The display panel DP is not specifically limited. For example, the display panel DP may include various display panels, such as a liquid crystal display panel, an organic light emitting display panel, an electrophoretic display panel, and/or an electrowetting display panel. According to an embodiment of the inventive concept, a liquid crystal display panel will be described as an example of the display panel DP for convenience. The liquid crystal display device including the liquid crystal display panel may further include a polarizer and a backlight unit (e.g., a backlight or a backlight source).

When the display panel DP includes the liquid crystal display panel, the display panel DP includes a first substrate DS1, a second substrate DS2 spaced from the first substrate DS1, and a liquid crystal layer (LCL) between the first substrate DS1 and the second substrate DS2. The display panel DP includes a display area DA at which a plurality of pixels PX11 to PXnm are located, and a non-display area NDA surrounding the display area DA.

The display panel DP includes a plurality of gate lines GL1 to GLn on the first substrate DS1, and a plurality of data lines DL1 to DLm crossing the gate lines GL1 to GLn. The plurality of gate lines GL1 to GLn are connected to the gate driving circuit 100. The plurality of data lines DL1 to DLm are connected to the data driving circuit 200. For convenience, FIG. 1 illustrates only a portion of (e.g., some of) the plurality of gate lines GL1 to GLn and a portion of (e.g., some of) the plurality of data lines DL1 to DLm.

For convenience, FIG. 1 illustrates only a portion of (e.g., some of) the plurality of pixels PX11 to PXnm. The plurality of pixels PX11 to PXnm are connected to corresponding gate lines of the plurality of gate lines GL1 to GLn, and connected to corresponding data lines of the plurality of data lines DL1 to DLm.

The plurality of pixels PX11 to PXnm may be defined into a plurality of groups according to displayable colors. Each of the plurality of pixels PX11 to PXnm may display one of primary colors. The primary colors may include red, green, blue, and white colors. However, the inventive concept is not limited thereto. For example, the primary colors may include various colors, such as yellow, cyan, and/or magenta.

Each of the gate driving circuit 100 and the data driving circuit 200 receives control signals from the driving controller 300. The driving controller 300 may be mounted on a main circuit board MCB. The driving controller 300 receives image data and control signals from an external graphic control unit (e.g., an external graphic controller). The control signals may include: a vertical synchronization signal Vsync that is a signal for indicating frame periods Ft−1, Ft, and Ft+1; a horizontal synchronization signal Hsync that is a signal for indicating horizontal periods HP (e.g., a row indication signal); a data enable signal having an enabling level (e.g., a high level) during a period (e.g., only during a period) for which data is outputted to display a data input section; and a clock signal.

The gate driving circuit 100 generates gate signals G1 to Gn based on the control signals (hereinafter, referred to as gate control signals) received from the driving controller 300 through signal lines GSL during the frame periods Ft−1, Ft, and Ft+1, and outputs the gate signals G1 to Gn to the plurality of gate lines GL1 to GLn. The gate signals G1 to Gn may be sequentially (e.g., successively) outputted corresponding to the horizontal periods HP. The gate driving circuit 100 may be concurrently (e.g., simultaneously) formed together with the pixels PX11 to PXnm through a thin film process. For example, the gate driving circuit 100 may be mounted on the non-display area NDA in the form of an oxide semiconductor TFT gate driver circuit (OSG).

FIG. 1 illustrates an example of a single gate driving circuit 100 connected to left ends of the plurality of gate lines GL1 to GLn. However, the inventive concept is not limited thereto, for example, in another embodiment of the inventive concept, the display device may include two gate driving circuits. One of the two gate driving circuits may be connected to the left ends of the plurality of gate lines GL1 to GLn, and the other one may be connected to right ends of the plurality of gate lines GL1 to GLn. Also, one of the two gate driving circuits may be connected to odd-numbered gate lines, and the other one of the two gate driving circuits may be connected to even-numbered gate lines.

The data driving circuit 200 generates gradation (e.g., gray level) voltages according to image data provided from the driving controller 300 based on a control signal (hereinafter, referred to as a data control signal) received from the driving controller 300. The data driving circuit 200 outputs the gradation (e.g., the gray level) voltages to the data lines DL1 to DLm as data voltages DS.

The data voltages DS may include positive data voltages each having a positive value (e.g., a positive polarity), and negative data voltages each having a negative value (e.g., a negative polarity), with respect to a common voltage. Some of the data voltages applied to the data lines DL1 to DLm during each of the horizontal periods HP may each have a positive polarity, and others of the data voltages may each have a negative polarity. The polarities of the data voltages DS may be inverted according to the frame periods Ft−1, Ft, and Ft+1 to prevent or substantially prevent liquid crystals from being degraded. The data driving circuit 200 may generate the data voltages that are inverted during a frame period unit in response to an inversion signal.

The data driving circuit 200 may include a driving chip 210, and a flexible circuit board 220 on which the driving chip 210 is mounted. The data driving circuit 200 may include a plurality of driving chips 210 and a plurality of flexible circuit boards 220. The flexible circuit board 220 electrically connects the main circuit board MCB to the first substrate DS1. The plurality of driving chips 210 provide corresponding data signals to corresponding data lines of the plurality of data lines DL1 to DLm.

FIG. 1 illustrates an example of a tape carrier package (TCP)-type (e.g., kind) data driving circuit 200. In another embodiment of the inventive concept, the data driving circuit 200 may be located on the non-display area NDA of the first substrate DS1 in a chip on glass (COG) manner.

Figure 3:
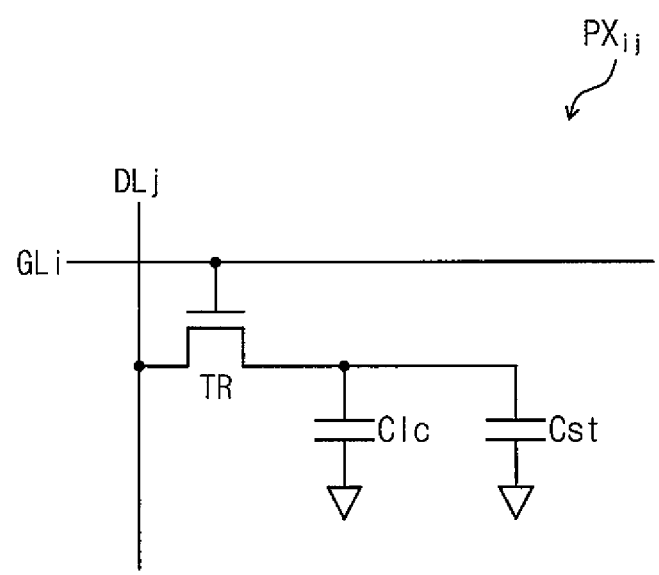
FIG. 3 is an equivalent circuit diagram of a pixel according to an embodiment of the inventive concept.
Figure 4:
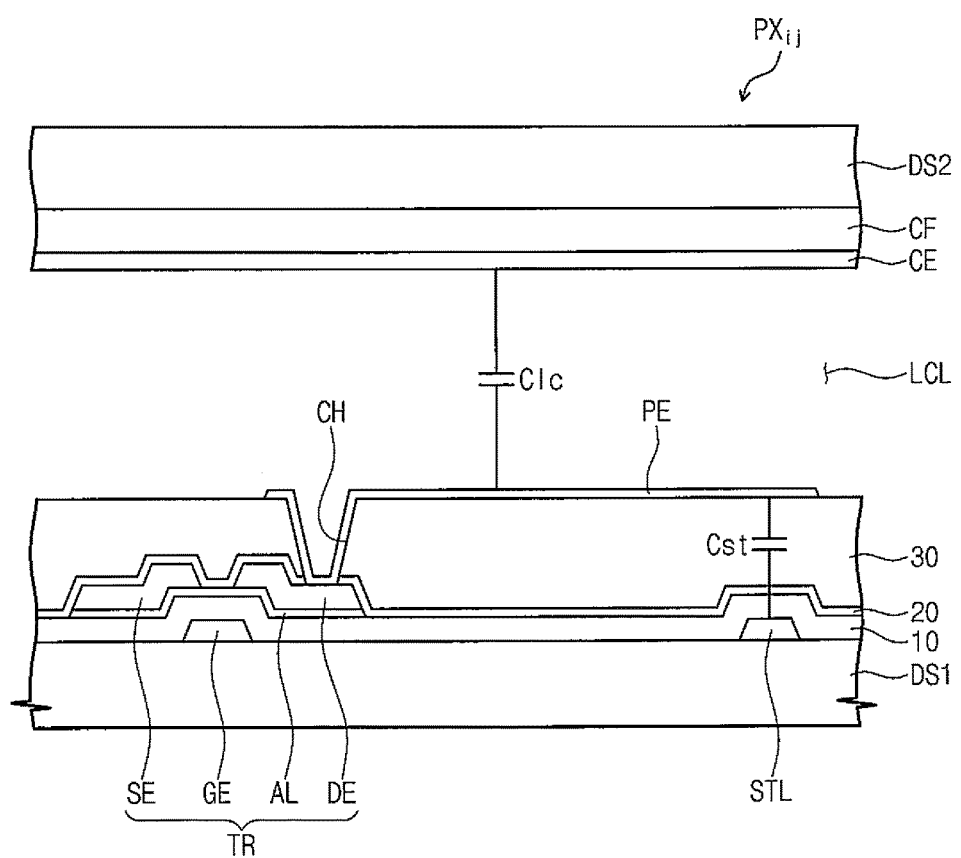
FIG. 4 is a cross-sectional view of the pixel according to an embodiment of the inventive concept.

FIG. 3 is an equivalent circuit diagram of a pixel according to an embodiment of the inventive concept. FIG. 4 is a cross-sectional view of the pixel according to an embodiment of the inventive concept. Each of the plurality of pixels PX11 to PXnm of FIG. 1 may have the same or substantially the same structure as that of FIG. 3.

Referring to FIG. 3, a pixel PXij includes a pixel thin film transistor TR (hereinafter, referred to as a pixel transistor), a liquid crystal capacitor Clc, and a storage capacitor Cst. Hereinafter, the transistor may be a thin film transistor. In an embodiment of the inventive concept, the storage capacitor Cst may be omitted.

The pixel transistor TR may be electrically connected to an i-th gate line GLi and a j-th data line DLj. The pixel transistor TR outputs a pixel voltage corresponding to a data signal received from the j-th data line DLj in response to a gate signal received from the i-th gate line GLi.

The liquid crystal capacitor Clc is charged by the pixel voltage outputted from the pixel transistor TR. An arrangement of liquid crystal directors in the liquid crystal layer LCL (see FIG. 4) may be changed according to an amount of electric charges charged in the liquid crystal capacitor Clc. Light incident into the liquid crystal layer may be transmitted or blocked according to the arrangement of the liquid crystal directors.

The storage capacitor Cst may be connected in parallel to the liquid crystal capacitor Clc. The storage capacitor Cst may maintain or substantially maintain the arrangement of the liquid crystal directors during a period (e.g., a predetermined period).

As illustrated in FIG. 4, the pixel transistor TR includes a control electrode GE connected to the i-th gate line GLi (see FIG. 3), an activation unit (e.g., an active layer) AL overlapping the control electrode GE, a first electrode SE connected to the j-th data line DLj (see FIG. 3), and a second electrode DE spaced from the first electrode SE.

The liquid crystal capacitor Clc includes a pixel electrode PE and a common electrode CE. The storage capacitor Cst includes the pixel electrode PE and a portion of a storage line STL overlapping the pixel electrode PE.

The i-th gate line GLi and the storage line STL are located on one surface of the first substrate DS1. The control electrode GE is branched from the i-th gate line GLi. The i-th gate line GLi and the storage line STL may be formed of a metal, e.g., Ag, Cu, Mo, Cr, Ta, Ti, or a combination thereof. The i-th gate line GLi and the storage line STL may include a multi-layered structure, e.g., a Ti layer and a Cu layer.

A first insulation layer 10 covering the control electrode GE and the storage line STL is located on the one surface of the first substrate DS1. The first insulation layer 10 may include at least one of an inorganic material and an organic material. The first insulation layer 10 may be an organic layer or inorganic layer. The first insulation layer 10 may include a multi-layered structure, for example, a silicon nitride layer and a silicon oxide layer.

The activation unit AL overlapping the control electrode GE is located on the first insulation layer. The activation unit AL may include a semiconductor layer and an ohmic contact layer. The semiconductor layer may be located on the first insulation layer 10, and the ohmic contact layer may be located on the semiconductor layer.

The first electrode SE and the second electrode DE are located on the activation unit AL. The second electrode DE and the first electrode SE are located to be spaced from each other. Each of the second electrode DE and the first electrode SE partially overlaps the control electrode GE.

A second insulation layer 20 covering the activation unit AL, the second electrode DE, and the first electrode SE is located on the first insulation layer 10. The second insulation layer 20 may include at least one of an inorganic material and an organic material. The second insulation layer 20 may be an organic layer or inorganic layer. The second insulation layer 20 may include a multi-layered structure, for example, a silicon nitride layer and a silicon oxide layer.

Although the pixel transistor TR having a staggered structure is illustrated as an example in FIG. 1, the structure of the pixel transistor TR is not limited thereto. For example, in some embodiments, the pixel transistor TR may have a planar structure.

A third insulation layer 30 is located on the second insulation layer 20. The third insulation layer 30 provides a planarization surface. The third insulation layer 30 may include an organic material.

The pixel electrode PE is located on the third insulation layer 30. The pixel electrode PE is connected to the second electrode DE through a contract hole CH passing through the second and third insulation layers 20 and 30. An alignment layer covering the pixel electrode PE may be located on the third insulation layer 30.

A color filter layer CF is located on a surface of the second substrate DS2. The common electrode CE is located on the color filter layer CF. A common voltage is applied to the common electrode CE. The common voltage and the pixel voltage may have values different from each other. An alignment layer covering the common electrode CE may be located on the common electrode CE. In some embodiments, another insulation layer may be located between the color filter layer CF and the common electrode CE.

The pixel electrode PE and the common electrode CE with the liquid crystal layer LCL therebetween may form the liquid crystal capacitor Clc. Also, a portion of the pixel electrode PE and the storage line STL, with the first, second, and third insulation layers 10, 20, and 30 therebetween, may form the storage capacitor Cst. The storage line STL receives a storage voltage having a value different from that of the pixel voltage. The storage voltage may have the same or substantially the same value as the common voltage.

The cross-section of the pixel PXij of FIG. 3 may be merely an example. Unlike the structure of FIG. 3, at least one of the color filter layer CF and the common electrode CE may be located on the first substrate DS1. That is, the liquid crystal display panel according to an embodiment may include pixels, such as a vertical alignment (AV) mode pixel, a patterned vertical alignment (PVA) mode pixel, an in-plane switching (IPS) mode pixel, a fringe-field switching (FFS) mode pixel, and/or a plane to line switching (PLS) mode pixel.

Figure 5:
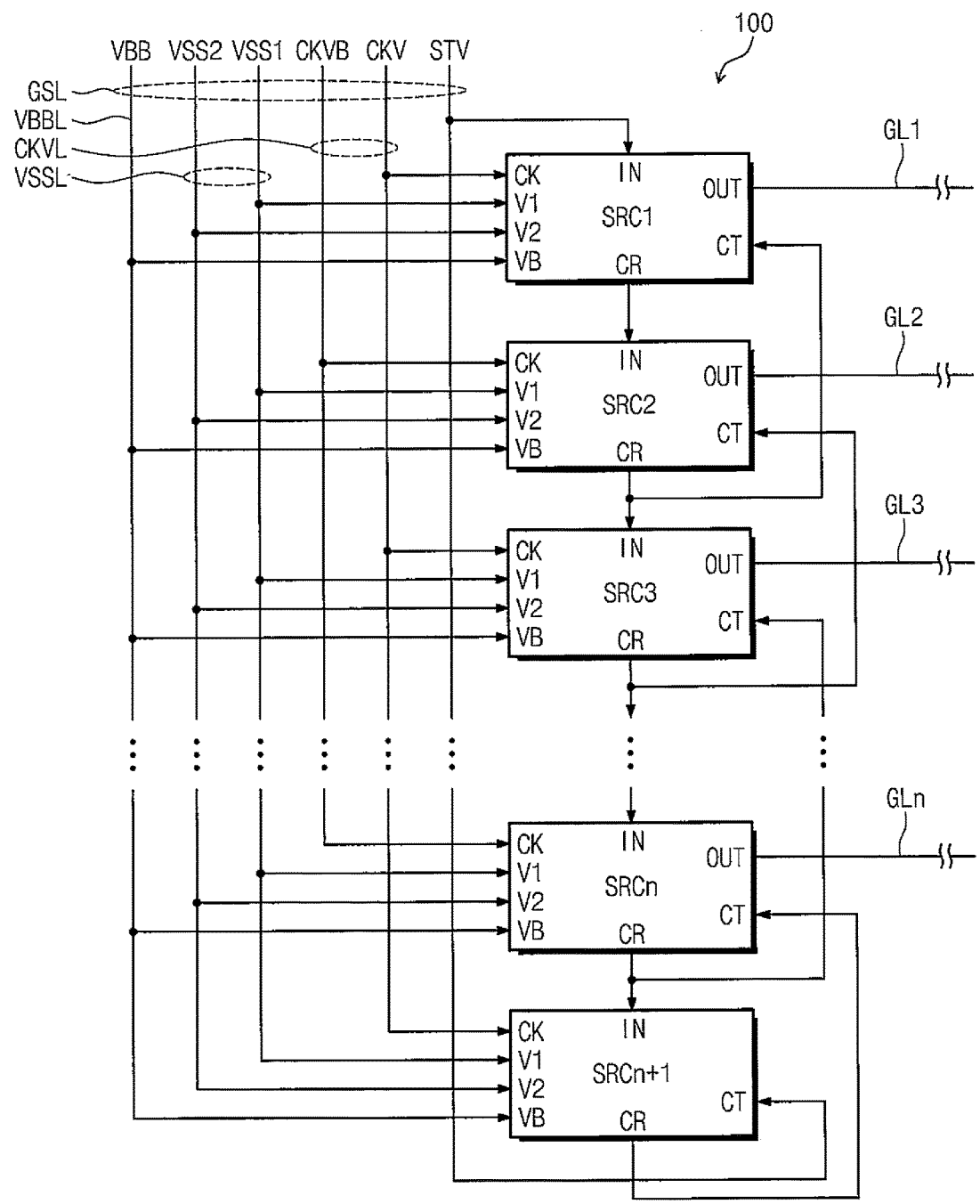
FIG. 5 is a block diagram of a gate driving circuit according to an embodiment of the inventive concept.

FIG. 5 is a block diagram of a gate driving circuit according to an embodiment of the inventive concept. Referring to FIG. 5, the gate driving circuit 100 includes a plurality of driving stages SRC1 to SRCn, and a dummy driving stage SRCn+1. The plurality of driving stages SRC1 to SRCn and the dummy driving stage SRCn+1 may have a subordinating connective relationship to operate in response to a carry signal outputted from the former stage and a carry signal outputted from the next stage.

Each of the plurality of driving stages SRC1 to SRCn receives a first clock signal CKV, a second clock signal CKVB, a first voltage (e.g., a first ground voltage or a first low voltage) VSS1, a second voltage (e.g., a second ground voltage or a second low voltage) VSS2, and a back bias control voltage VBB from the driving controller 300 (see FIG. 1) through the signal lines GSL. A first driving stage SRC1 and the dummy driving stage SRCn+1 may further receive a start signal STV. The signal lines GSL include a back bias voltage signal line VBBL for transmitting the back bias voltage VBB, clock signal lines CKVL for transmitting the first clock signal CKV and the second clock signal CKVB, and voltage lines (e.g., ground voltage lines or low voltage lines) VSSL for transmitting the first voltage VSS1 and the second voltage VSS2.

According to an embodiment, the plurality of driving stages SRC1 to SRCn may be connected to the plurality of gate lines GL1 to GLn, respectively. The plurality of driving stages SRC1 to SRCn provide gate signals to the plurality of gate lines GL1 to GLn, respectively. In an embodiment of the inventive concept, the gate lines connected to the plurality of driving stages SRC1 to SRCn may be odd-numbered gate lines and/or even-numbered gate lines of the gate lines GL1 to GLn.

Each of the plurality of driving stages SRC1 to SRCn includes an output terminal OUT, and each of the plurality of driving stages SRC1 to SRCn and the dummy driving stage SRCn+1 includes a carry terminal CR, an input terminal IN, a control terminal CT, a clock terminal CK, a first ground terminal V1, a second ground terminal V2, and a bias voltage terminal VB.

The output terminal OUT of each of the plurality of driving stages SRC1 to SRCn is connected to a corresponding gate line of the plurality of gate lines GL1 to GLn. The gate signals generated from the plurality of driving stages SRC1 to SRCn are provided to the plurality of gate lines GL1 to GLn through the output terminals OUT.

The carry terminal CR of each of the plurality of driving stages SRC1 to SRCn is electrically connected to the input terminal IN of a next driving stage that is driven following the corresponding driving stage. The carry terminal CR of each of the plurality of driving stages SRC1 to SRCn outputs a carry signal.

The input terminal IN of each of the plurality of driving stages SRC1 to SRCn and the dummy driving stage SRCn+1 receives the carry signal of a previous driving stage of the corresponding driving stage. For example, the input terminal IN of a third driving stage SRC3 receives a carry signal of a second driving stage SRC2. The input terminal of the first driving stage SRC1 of the plurality of driving stages SRC1 to SRCn receives the start signal STV for starting an operation of the gate driving circuit 100, instead of the carry signal of a previous driving stage.

The control terminal CT of each of the plurality of driving stages SRC1 to SRCn is electrically connected to the carry terminal CR of the next driving stage that is driven following the corresponding driving stage. The control terminal CT of each of the plurality of driving stages SRC1 to SRCn receives the carry signal of the next driving stage that is driven following the corresponding driving stage. For example, the control terminal CT of the second driving stage SRC2 receives a carry signal outputted from the carry terminal CR of the third driving stage SRC3. In another embodiment of the inventive concept, the control terminal CT of each of the plurality of driving stages SRC1 to SRCn may be electrically connected to the output terminal OUT of the next driving stage that is driven following the corresponding driving stage.

The control terminal CT of the n-th driving stage SRCn located at the end receives a carry signal outputted from the carry terminal CR of the dummy stage SRCn+1. The control terminal CT of the dummy stage SRCn+1 receives the start signal STV.

The clock terminal CK of each of the plurality of driving stages SRC1 to SRCn receives one of the first clock signal CKV and the second clock signal CKVB. For example, each of the clock terminals CK of odd-numbered driving stages (e.g., SRC1 and SRC3) of the plurality of driving stages SRC1 to SRCn receives the first clock signal CKV, and each of the clock terminals CK of even-numbered driving stages (e.g., SRC2 and SRC4) of the plurality of driving stages SRC1 to SRCn receives the second clock signal CKVB. The first clock signal CKV and the second clock signal CKVB may be signals having phases that are different from each other.

The first ground terminal V1 of each of the plurality of driving stages SRC1 to SRCn receives the first voltage (e.g., the first ground voltage or the first low voltage) VSS1. The second ground terminal V2 of each of the plurality of driving stages SRC1 to SRCn receives the second voltage (e.g., the second ground voltage or the second low voltage) VSS2. The first and second voltages VSS1 and VSS2 may have voltage levels that are different from each other, and the second voltage VSS2 may have a level that is less than that of the first voltage VSS1.

The bias voltage terminal VB of each of the plurality of driving stages SRC1 to SRCn receives the back bias control voltage VBB. The back bias control voltage VBB will be described below in more detail.

In an embodiment of the inventive concept, each of the driving stages SRC1 to SRCn may omit one of the output terminal OUT, the input terminal IN, the carry terminal CR, the control terminal CT, the clock terminal CK, the first ground terminal V1, and the second ground terminal V2, or may further include other terminals according to a circuit configuration thereof. For example, one of the first and second ground terminals V1 and V2 may be omitted. In this case, each of the plurality of driving stages SRC1 to SRCn may receive only one of the first and second voltages VSS1 and VSS2. Also, a connection relationship between the plurality of driving stages SRC1 to SRCn may variously be changed.

Figure 6:
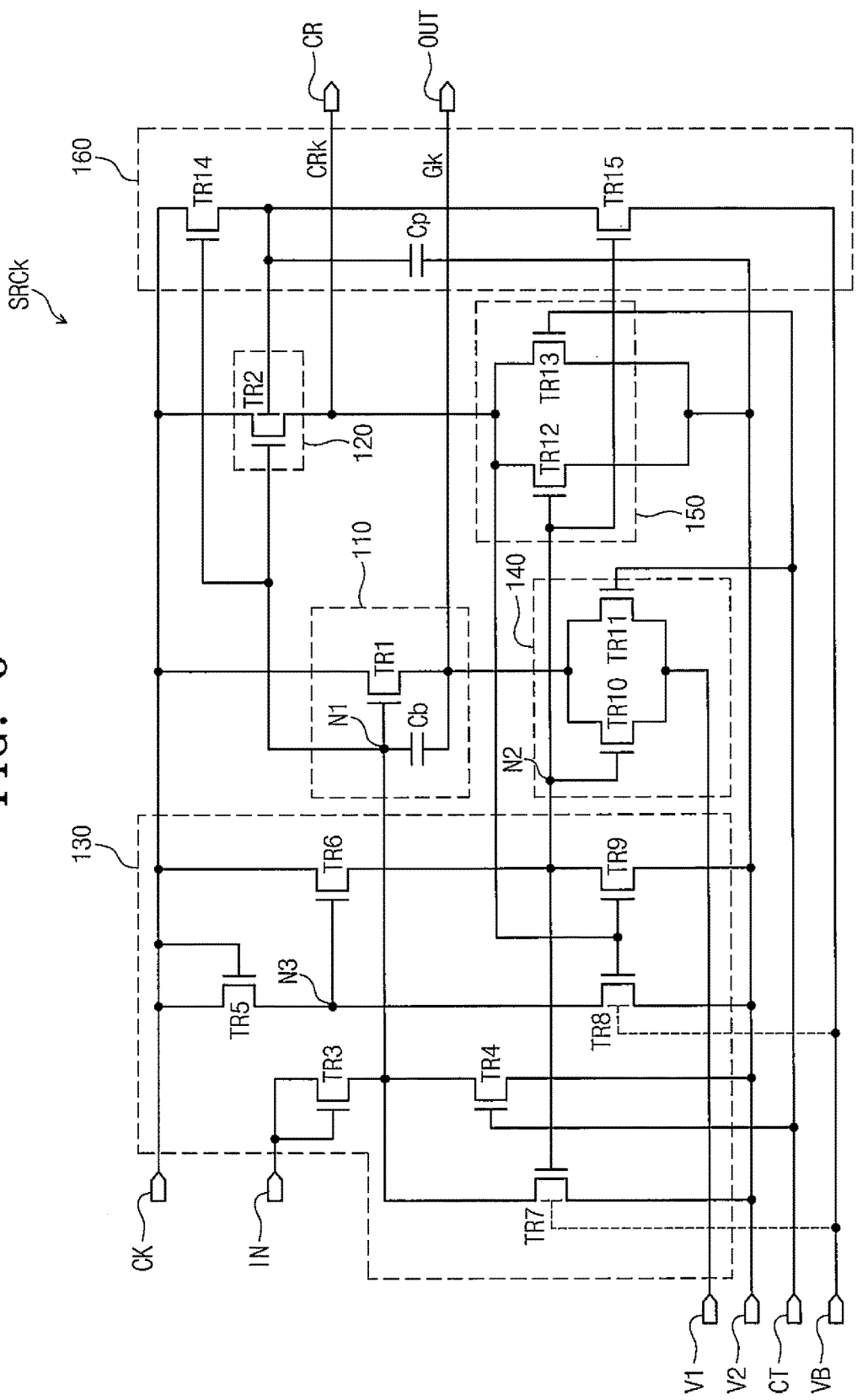
FIG. 6 is a circuit diagram of a driving stage according to an embodiment of the inventive concept.

FIG. 6 is a circuit diagram of a driving stage according to an embodiment of the inventive concept.

FIG. 6 illustrates an example of a k-th driving stage SRCk (where k is a positive integer) from among the plurality of driving stages SRC1 to SRCn of FIG. 5. Each of the driving stages SRC1 to SRCn of FIG. 5 may have the same or substantially the same circuit configuration as that of the k-th driving stage SRCk.

Referring to FIG. 6, the k-th driving stage SRCk includes a first output unit (e.g., a first output portion or a first output circuit portion) 110, a second output unit (e.g., a second output portion or a second output circuit portion) 120, a control unit (e.g., a control portion or a control circuit portion) 130, a first pull-down unit (e.g., a first pull-down portion or a first pull-down circuit portion) 140, a second pull-down unit (e.g., a second pull-down portion or a second pull-down circuit portion) 150, and a back bias selection unit (e.g., a back bias selection portion or a back bias selection circuit portion) 160.

The first output unit 110 outputs a k-th gate signal Gk, and the second output unit 120 outputs a k-th carry signal CRk. The first pull-down unit 140 pulls down the output terminal OUT to the first voltage (e.g., the first ground voltage or the first low voltage) VSS1 connected to the first ground terminal V1. The second pull-down unit 150 pulls down the carry terminal CR to the second voltage (e.g., the second ground voltage or the second low voltage) VSS2 connected to the second ground terminal V2. The control unit 130 controls operations of the first output unit 110, the second output unit 120, the first pull-down unit 140, and the second pull-down unit 150.

A detailed structure of the k-th driving stage SRCk will be described below in more detail.

The first output unit 110 includes a first output transistor TR1. The first output transistor TR1 includes a first electrode connected to the clock terminal CK, a control electrode connected to a first node N1, and a second electrode to output the k-th gate signal Gk.

The second output unit 120 includes a second output transistor TR2. The second output transistor TR2 includes a first electrode connected to the clock terminal CK, a control electrode connected to the first node N1, a second electrode to output the k-th carry signal CRk, and a back gate electrode.

As illustrated in FIG. 5, portions or some (e.g., the driving stages SRC1, SRC3, . . . , SRCn−1) of the driving stages SRC1 to SRCn, and the clock terminal CK of the dummy driving stages SRCn+1, receive the first clock signal CKV. The clock terminal CK of the other (e.g., the remaining) driving stages (e.g., SRC2, SRC4, . . . , SRCn) of the driving stages SRC1 to SRCn receive the second clock signal CKVB. The clock signal CKV and the clock signal CKVB are signals that are in complementary relationship with each other. That is, the first clock signal CKV and the second clock signal CKVB may have a phase difference of 180°.

The control unit 130 turns on the first and second output transistors TR1 and TR2 in response to a (k−1)-th carry signal CRk−1 received from the previous driving stage SRCk−1 at the input terminal IN. The control unit 130 turns off the first and second output transistors TR1 and TR2 in response to a (k+1)-th carry signal CRk+1 received from the next driving stage SRCk+1 at the control terminal CT. Also, the control unit 130 controls the first pull-down unit 140 and the second pull-down unit 150 in response to the first or second clock signal CKV or CKVB received through the clock terminal CK and the (k+1)-th carry signal CRk+1 received from the control terminal CT.

The control unit 130 includes third to ninth transistors TR3 to TR9. The third transistor TR3 is connected between the input terminal IN and the first node N1, and includes a control electrode connected to the input terminal IN. The fourth transistor TR4 is connected between the first node N1 and the second ground terminal V2, and includes a control electrode connected to the control terminal CT.

The fifth transistor TR5 is connected between the clock terminal CK and a third node N3, and includes a control electrode connected to the clock terminal CK. The sixth transistor TR6 is connected between the clock terminal CK and a second node N2, and includes a control electrode connected to the third node N3. The seventh transistor TR7 is connected between the first node N1 and the second ground terminal V2, and includes a control electrode connected to the second node N2. The eighth transistor TR8 is connected between the third node N3 and the second ground terminal V2, and includes a control electrode connected to the second electrode of the second output transistor TR2. The ninth transistor TR9 is connected between the second node N2 and the second ground terminal V2, and includes a control electrode connected to the second electrode of the second output transistor TR2.

The first pull-down unit 140 includes a tenth transistor TR10 and an eleventh transistor TR11. The tenth transistor TR10 is connected between the second electrode of the first output transistor TR1 and the first ground terminal V1, and includes a control electrode connected to the second node N2. The eleventh transistor TR11 is connected between the second electrode of the first output transistor TR1 and the first ground terminal V1, and includes a control electrode connected to the control terminal CT.

The second pull-down unit 150 includes a twelfth transistor TR12 and a thirteenth transistor TR13. The twelfth transistor TR12 is connected between the second electrode of the second output transistor TR2 and the second ground terminal V2, and includes a control electrode connected to the second node N2. The thirteenth transistor TR13 is connected between the second electrode of the second output transistor TR2 and the second ground terminal V2, and includes a control electrode connected to the control terminal CT.

The second output transistor TR2 within the driving stage SRCk of FIG. 6 may be a four-terminal transistor in which a threshold voltage is adjustable. However, the inventive concept is not limited thereto, and the seventh and eighth transistors TR7 and TR8, or the other transistors as well as the second output transistor TR2, may be each provided as the four-terminal transistor in which the threshold voltage is adjustable.

Hereinafter, a structure in which only the second output transistor TR2 is the four-terminal transistor will be described as an example. The second output transistor TR2 further includes the bias control electrode, in addition to the first electrode, the second electrode, and the control electrode. The bias control electrode of the second output transistor TR2 is connected to the bias voltage terminal VB through a fifteenth transistor TR15. However, when each of the seventh transistor TR7 and the eighth transistor TR8 also includes a bias control electrode, the bias control electrode of each of the second output transistor TR2, the seventh transistor TR7, and the eighth transistor TR8 may be connected to the bias voltage terminal VB.

Although each of the second output transistor TR2, the seventh transistor TR7, and the eighth transistor TR8 may include the four-terminal transistor as described above, the inventive concept is not limited thereto. For example, at least one of the second output transistor TR2, the seventh transistor TR7, and the eighth transistor TR8 may include the four-terminal transistor. In another embodiment, at least one of the transistors TR1, TR3 to TR6, and TR9 to TR13 within the driving stage SRCk may include the four-terminal transistor, or each of the transistors TR1 to TR13 may include the four-terminal transistors.

The back bias selection unit 160 provides one of the clock signal CK and the back bias control voltage VBB to the back gate electrode of the second output transistor TR2, in response to the signal at the first node N1. The back bias selection unit 160 includes a fourteen transistor TR14, the fifteenth transistor TR15, and a capacitor Cp. The fourteen transistor TR14 is connected between the back gate electrode of the second output transistor TR2 and the clock terminal CK, and includes a control electrode connected to the first node N1. The fifteen transistor TR15 is connected between the back gate electrode of the second output transistor TR2 and the bias terminal VB, and includes a control electrode connected to the second node N2. The capacitor Cp is connected between the back gate electrode of the second output transistor TR2 and the second ground terminal V2.

When the k-th carry signal CRk has a low level, the signal of the second node N2 has a high level (e.g., the clock signal CK has a high level), and the fifteen transistor TR15 is turned on to provide the back bias control voltage VBB received from the bias terminal VB to the back gate electrode of the second output transistor TR2. When the signal of the second node N2 has a low level (e.g., the clock signal CK has a low level), the fifteen transistor TR15 may be turned off. However, the voltage provided to the back gate electrode of the second output transistor TR2 may be maintained or substantially maintained as the back bias control voltage VBB by the capacitor Cp.

When the signal of the first node N1 has a high level (e.g., the (k−1)-th carry signal CRk−1 received at the input terminal IN has a high level), and the clock signal CKV received at the clock terminal CK has a high level, the fourteenth transistor TR14 is turned on to provide the clock signal CKV to the back gate electrode of the second output transistor TR2. The clock signal CKV may be a signal that is swung between the second voltage VSS2 (e.g., the second ground voltage) and a set or predetermined voltage (e.g., about 10 V).

When the k-th carry signal CRk having a relatively high voltage level is outputted, in the case where the back bias control voltage VBB having a negative voltage level is provided to the back gate electrode of the second output transistor TR2, a voltage difference between the back gate electrode and the second electrode of the second output transistor TR2 increases. The voltage difference may act as a voltage stress of the second output transistor TR2 to cause degradation of the second output transistor TR2.

As described above, the back bias selection unit 160 may provide the back bias control voltage VBB to the back gate electrode of the second output transistor TR2. Also, when the k-th carry signal CRk is outputted, the back bias selection unit 160 may provide the clock signal CK having a set or predetermined voltage level to the back gate electrode of the second output transistor TR2. Thus, the voltage stress of the second output transistor TR2 may be minimized or reduced.

Figure 7:
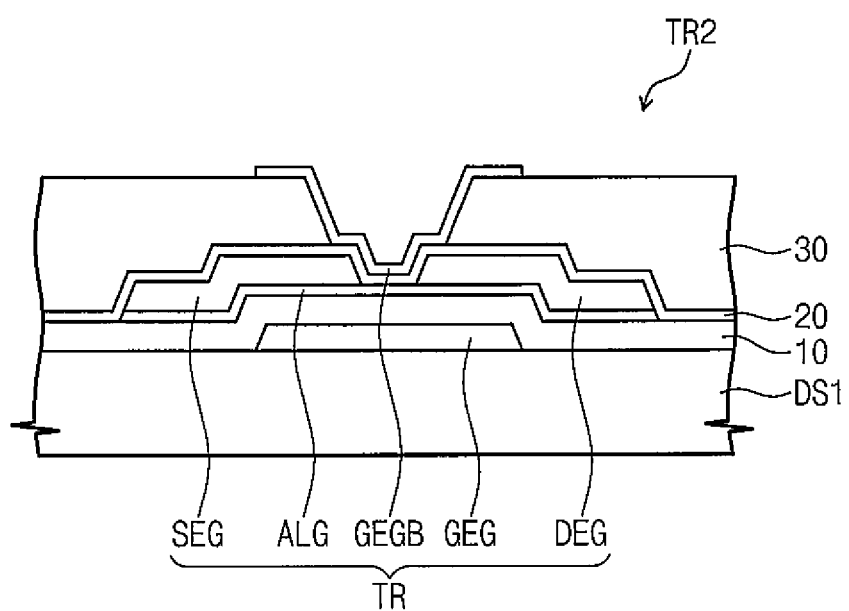
FIG. 7 is a cross-sectional view of a second output transistor of FIG. 6.

FIG. 7 is a cross-sectional view of the second output transistor TR2 of FIG. 6. Although only the cross-section of the second output transistor TR2 is illustrated in FIG. 7, other four-terminal transistors within the driving stages may have the same or substantially the same structure as that of the second output transistor TR2.

Referring to FIG. 7, the second output transistor TR2 includes a control electrode GEG connected to the first node N1, an activation unit ALG overlapping the control electrode GEG, a first electrode SEG connected to the clock terminal CK, and a second electrode DEG spaced form the first electrode SEG.

The second output transistor TR2 may be located on the first substrate DS1, like the pixel transistor TR described in FIG. 4. A first insulation layer 10 covering the control electrode GEG and the storage line STL is located on one surface of the first substrate DS1. The first insulation layer 10 may include at least one of an inorganic material and an organic material. The first insulation layer may be an organic layer or inorganic layer. The first insulation layer may include a multi-layered structure, for example, a silicon nitride layer and a silicon oxide layer.

The activation unit (e.g., the active layer) ALG is located on the first insulation layer 10 to overlap the control electrode GEG. The activation unit ALG may include a semiconductor layer and an ohmic contact layer. The semiconductor layer may be located on the first insulation layer 10, and the ohmic contact layer may be located on the semiconductor layer.

The first electrode SEG and the second electrode DEG are located on the activation unit ALG. The second electrode DEG and the first electrode SEG are spaced apart from each other. Each of the second electrode DEG and the first electrode SEG partially overlaps the control electrode GEG.

A second insulation layer 20 (covering the activation layer ALG, the second electrode DEG, and the first electrode SEG) is located on the first insulation layer 10. The second insulation layer 20 may include at least one of an inorganic material and an organic material. The second insulation layer 20 may be an organic layer and/or inorganic layer. The second insulation layer 20 may include a multi-layered structure, for example, a silicon nitride layer and a silicon oxide layer.

A third insulation layer 30 is located on the second insulation layer 20. The third insulation layer 30 provides a planarization surface. The third insulation layer 30 may include an organic material.

A back gate electrode GEGB is located on the third insulation layer 30. A threshold voltage of the second output transistor TR may be changed (e.g., controlled) according to a back bias control voltage VBB provided to the back gate electrode GEGB.

Figure 8:
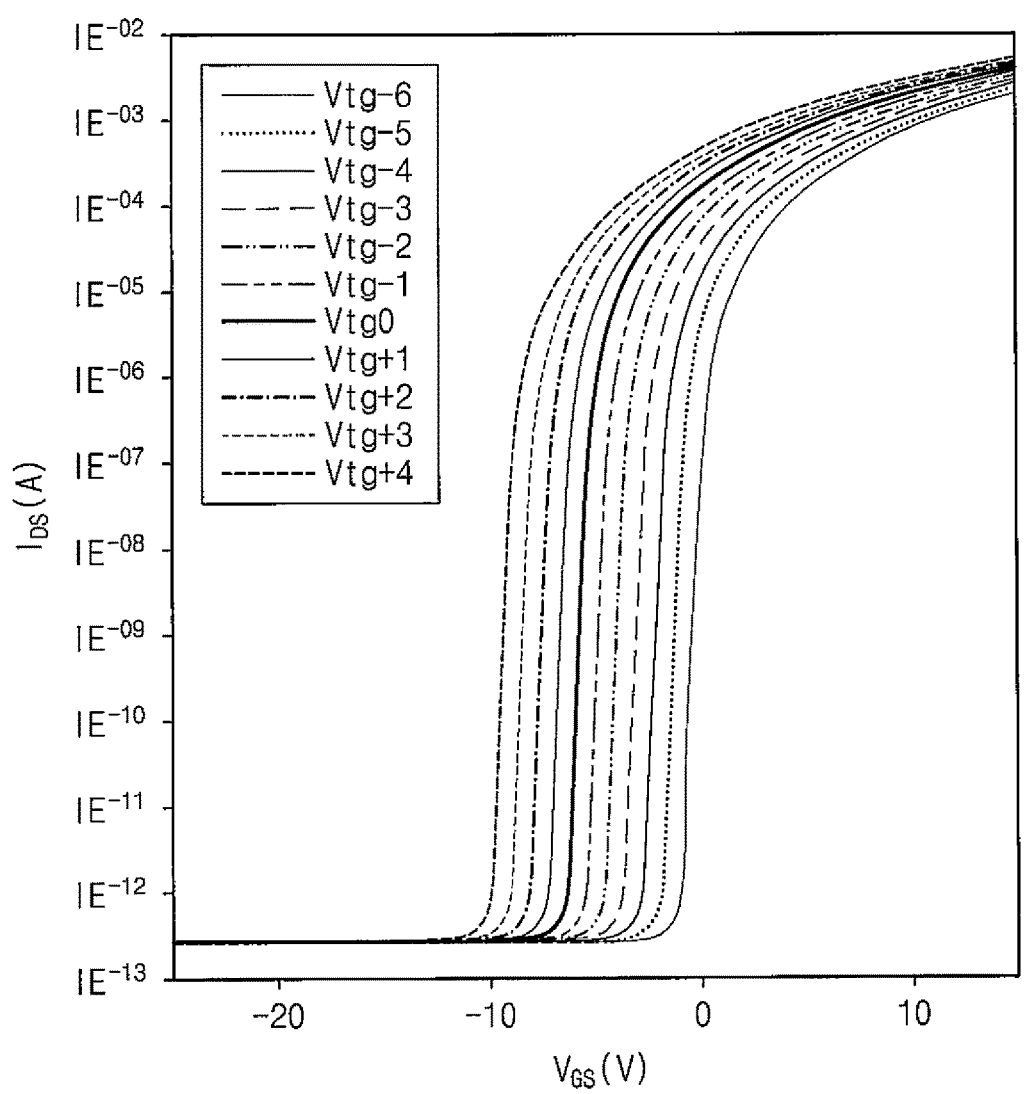
FIG. 8 is a view illustrating a variation in threshold voltage according to a bias voltage level provided to a back gate electrode of the second output transistor of FIG. 7.

FIG. 8 is a view illustrating a variation in threshold voltage according to a bias voltage level provided to a back gate electrode GEGB of the second output transistor TR2 of FIG. 7.

Referring to FIG. 8, as a voltage level of the back bias control voltage VBB provided to the back gate electrode GEGB of the second output transistor TR2 is lower than (e.g., decreases from) a reference voltage Vtg0, the threshold voltage of the second output transistor TR2 may be positive-shifted. Also, as the voltage level of the back bias control voltage VBB provided to the back gate electrode GEGB of the second output transistor TR2 is higher than (e.g., increases from) the reference voltage Vtg0, the threshold voltage of the second output transistor TR2 may be negative-shifted.

When the gate driving circuit 100 mounted on the non-display area NDA of the display panel DP of FIG. 1 in the form of the oxide semiconductor TFT gate driver circuit (OSG) operates at a high temperature for a long period of time, the threshold voltage of each of the transistors TR1 to TR13 of FIG. 6 may be negative-shifted. For example, a variation in threshold voltage of the second output transistor TR2 may have a large influence on the operation of the driving stage SRCk. Thus, when the threshold voltage of the second output transistor TR2 is negative-shifted, if the voltage level of the back bias control voltage VBB increases to a voltage higher than that of the reference voltage Vtg0, the threshold voltage of the second output transistor TR2 may return to a normal range.

Figure 9:
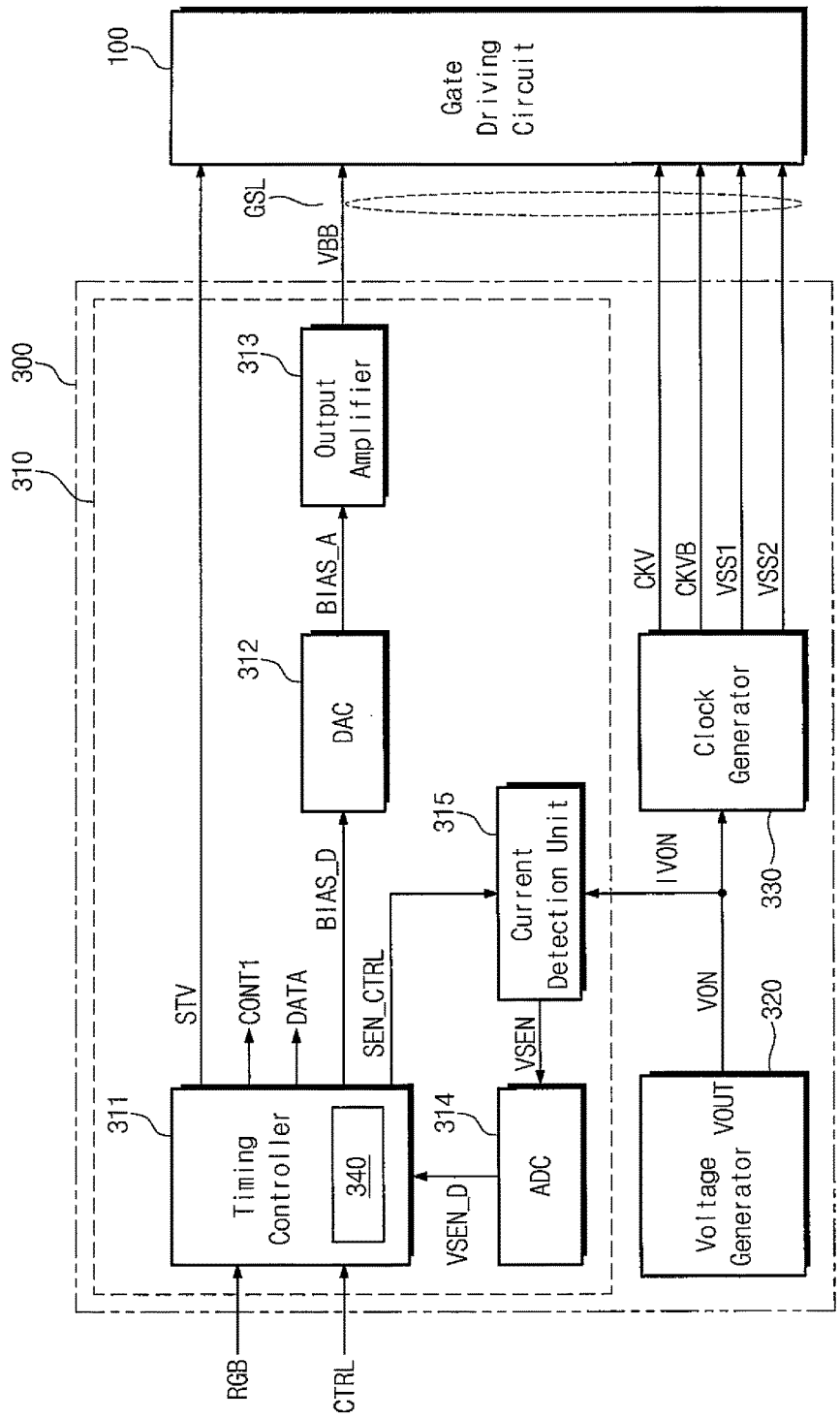
FIG. 9 is a block diagram illustrating a driving controller of FIG. 1.

FIG. 9 is a block diagram illustrating the driving controller of FIG. 1.

Referring to FIG. 9, the driving controller 300 includes a signal control unit (e.g., a signal controller) 310, a voltage generator 320, and a clock generator 330. The voltage generator 320 generates a gate on voltage VON to a voltage output terminal VOUT. The clock generator 330 receives the gate on voltage VON from the voltage generator 320 to generate a first clock signal CKV, a second clock signal CVKB, a first voltage (e.g., a first ground voltage or a first low voltage) VSS1, and a second voltage (e.g., a second ground voltage or a second low voltage) VSS2. The first clock signal CKV, the second clock signal CKVB, the first voltage VSS1, and the second voltage VSS2 are provided from the clock generator 330 to the gate driving circuit 100. Each of the first clock signal CKV and the second clock signal CKVB generated from the clock generator 330 may be a pulse signal that is swung between the gate on voltage VON and the second voltage VSS2. For example, the gate on voltage VON may be equal to about 10 V, the second voltage VSS2 may be equal to about −16 V, and the first voltage VSS1 may be equal to about −13 V.

The signal control unit 310 detects a variation in current of the voltage output terminal VOUT, and outputs a back bias control voltage VBB corresponding to the detected current variation. The signal control unit 310 includes a timing controller 311, a digital-analog converter 312, an output amplifier 313, an analog-digital converter 314, and a current detection unit (e.g., a current detector) 315.

The timing controller 311 receives an image signal RGB and a control signal CTRL from the outside. For example, the control signal CTRL includes a vertical synchronizing signal, a horizontal synchronizing signal, a main clock signal, and a data enable signal. The timing controller 311 provides a data signal DATA and a first control signal CONT1 to the data driving circuit 200 of FIG. 1, and provides the start signal STV to the gate driving circuit 100. The data signal DATA is obtained by processing the image signal RGB to match an operation condition of the display panel 110 based on the control signal CTRL. The first control signal CONT1 may include a horizontal synchronizing signal, a clock signal, and a line latch signal. The timing controller 311 may variously change and output the data signal DATA according to an arrangement of the plurality of pixels PX11 to PXnm of the display panel 110, and according to a display frequency. The timing controller 311 further outputs a detection control signal SEN_CTRL. The timing controller 311 may further include a back bias control unit (e.g., a back bias controller) 340.

The current detection unit 315 detects a variation in current IVON of the voltage output terminal VOUT in response to the detection control signal SEN_CTRL received from the timing controller 311, to output a detection voltage VSEN corresponding to the detection current IVON.

The analog-digital converter 314 converts the detection voltage VSEN received from the current detection unit 315 into a digital detection signal VSEN_D to provide the converted digital detection signal VSEN_D to the timing controller 311. The timing controller 311 outputs a bias voltage signal BIAS_D corresponding to the digital detection signal VSEN_D. The timing controller 311 may include a resistor, a look-up table, and a memory to store the bias voltage signal BIAS_D corresponding to the inputted digital detection signal VSEN_D.

The timing controller 311 may output the bias voltage signal BIAS_D corresponding to the received digital detection signal VSEN_D after a time (e.g., a set or predetermined time) elapses after outputting the detection control signal SEN_CTRL. The timing controller 311 may initially output the bias voltage signal BIAS_D corresponding to the reference voltage Vtg0 of FIG. 8.

The digital-analog converter 312 converts the bias voltage signal BIAS_D received from the timing controller 311 into an analog bias voltage signal BIAS_A. The output amplifier 313 amplifies the analog bias voltage signal BIAS_A to output a back bias control voltage VBB.

When the variation in the current of the voltage output terminal VOUT is greater than the reference level, the back bias control unit 340 searches and sets the back bias control voltage VBB to a level that is capable of minimizing or reducing a consumption current level of the voltage output terminal VOUT, while changing the back bias control voltage VBB by a level (e.g., a set or predetermined level) from a default voltage level. An operation of the back bias control unit 340 will be described below in more detail.

Figure 10:
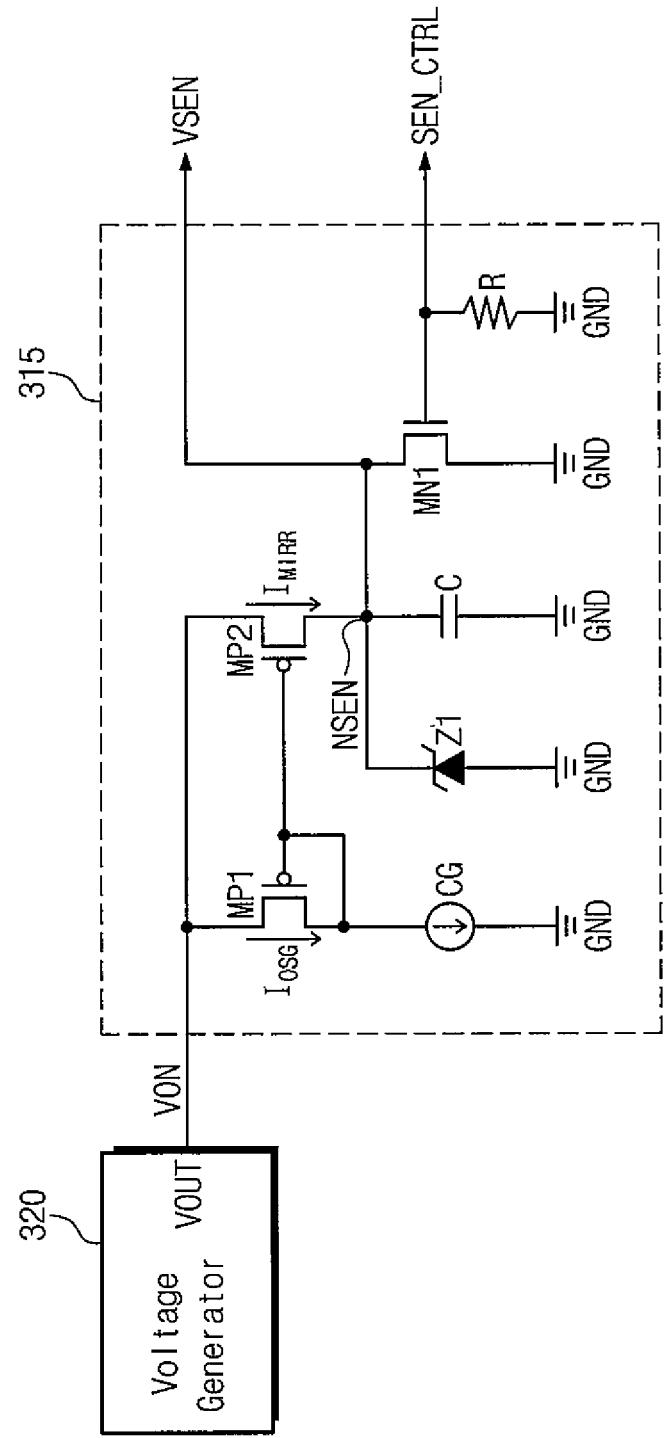
FIG. 10 is a view illustrating an example of a current detection unit of FIG. 9.

FIG. 10 is a view illustrating an example of a current detection unit (e.g., a current detector) of FIG. 9.

Referring to FIG. 10, the current detection unit 315 includes transistors MP1, MP2, and MN1, a capacitor C, a resistor R, a Zener diode Z1, and a grounded current source CG. The transistor MP1 is connected between the gate on voltage (e.g., a source or terminal of the gate on voltage) VON and an end of the current source CG. The transistor MP2 is connected between the gate on voltage (e.g., the source or terminal of the gate on voltage) VON and a detection node NSEN. The control electrodes of the transistors MP1 and MP2 are commonly connected to each other and connected to the end of the current source CG.

The Zener diode Z1 is connected between the detection node NSEN and the ground voltage. The capacitor C is connected to the detection node NSEN and the ground voltage. The transistor MN1 is connected between the detection node NSEN and the ground voltage, and includes a control electrode connected to the detection control signal (e.g., a source or terminal of the detection control signal) SEN_CTRL. The resistor R is connected between the control electrode of the transistor MN1 and the ground voltage.

Figure 11:
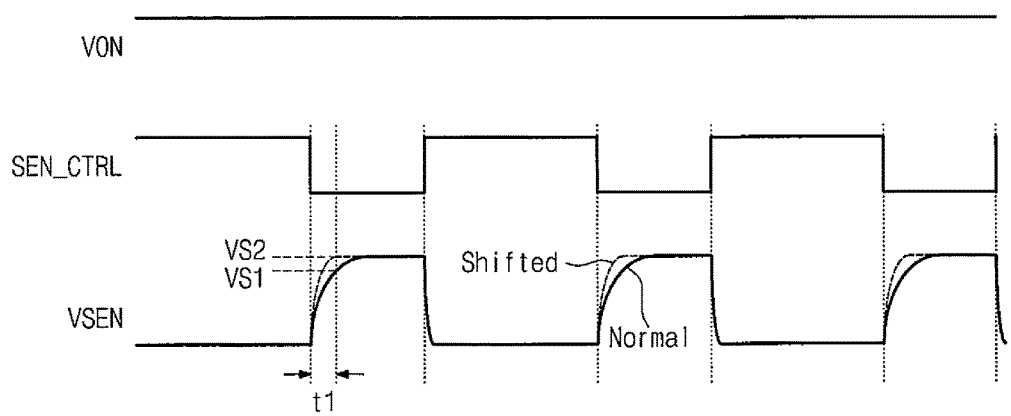
FIG. 11 is a timing diagram illustrating an operation of the current detection unit of FIG. 10.

FIG. 11 is a timing diagram illustrating an operation of the current detection unit of FIG. 10.

Referring to FIGS. 9, 10, and 11, the timing controller 311 outputs the detection control signal SEN_CTRL that is periodically transitioned to a low level. The voltage generator 320 outputs the gate on voltage VON to the voltage output terminal VOUT. The gate on voltage VON generated from the voltage generator 320 is constantly or substantially maintained at a set or predetermined level.

As described in FIGS. 6 and 7, when the gate driving circuit 100 operates at a high temperature for a long period of time, the threshold voltage of each of the transistors TR1 to TR13 may be negative-shifted. When the threshold voltage of each of the transistors TR1 to TR13 is negative-shifted, the transistors TR1 to TR13 may be turned on at a lower gate-source voltage VGS. Here, an amount of current leaking to the first or second ground terminal V1 or V2 from the clock terminal CK to the transistors TR1 to TR13 may increase.

The increase of the leakage current that is consumed in the gate driving circuit 100 may increase an amount of current that is outputted through the voltage output terminal VOUT of the voltage generator 320. Thus, the signal control unit 310 may detect a variation in current outputted through the voltage output terminal VOUT of the voltage generator 320 to determine whether the threshold voltage of each of the transistors TR1 to TR13 of the gate driving circuit 100 is shifted.

Referring again to FIGS. 10 and 11, when the gate on voltage VON having a set or predetermined level is supplied, an amount of current $I_{OSG}$ flowing through the transistor MP1, and an amount of current $I_{MIRR}$ flowing through the transistor MP2, may be the same or substantially the same. When the detection control signal SEN_CTRL has a high level, the transistor MN1 is turned on, and thus, a voltage at the detection node NSEN is discharged to the ground voltage GND. Thus, while the detection control signal SEN_CTRL has a high level, the detection voltage VSEN is maintained or substantially maintained at the level of the ground voltage GND.

When the detection control signal SEN_CTRL is transitioned to a low level, the transistor MN1 is turned off. Here, a voltage rising rate of the detection node NSEN may be determined according to an amount of the current $I_{MIRR}$ flowing through the transistor MP2. For example, if the threshold voltage of each of the transistors TR1 to TR13 of FIG. 6 belongs in the normal range, the detection voltage VSEN increases as indicated with a solid line in FIG. 11. If the threshold voltage of each of the transistors TR1 to TR13 of FIG. 6 is negative-shifted, the amount of current flowing through the transistor MP2 increases. Thus, the detection voltage VSEN may increase as indicated with the dotted line in FIG. 11. That is, the more the amount of current outputted to the voltage output terminal VOUT of the voltage generator 320, the more the voltage rising rate of the detection voltage VSEN increases. When a set or predetermined time t1 elapses after the detection control signal SEN_CTRL is transitioned to the low level, the voltage level of the detection voltage VSEN may be determined according to whether the threshold voltage of each of the transistors TR1 to TR13 is shifted. For example, if the voltage level of the detection voltage VSEN has a first level VS1 that is less than the reference level, it may be determined that the threshold voltages of the transistors TR1 to TR13 are in the normal range. On the other hand, if the voltage level of the detection voltage VSEN has a second level VS2 that is greater than the reference level, it may be determined that the threshold voltage of each of the transistors TR1 to TR13 is negative-shifted.

When the set or predetermined time t1 elapses after the detection control signal SEN_CTRL is transitioned to the low level, the timing controller 311 of FIG. 9 may determine whether the threshold voltage of each of the transistors TR1 to TR13 is shifted according to the received digital detection signal VSEN_D. If the received digital detection signal VSEN_D is out of the normal range, the timing controller 311 outputs the bias voltage signal BIAS_D, so that the threshold voltage of each of the transistors TR1 to TR13 is shifted to the preset normal range. The back bias control voltage VBB is provided to the gate driving circuit 100 by the digital-analog converter 312 and the output amplifier 313.

Referring again to FIG. 6, the threshold voltages of the second, seventh, and eighth transistors TR2, TR7, and TR8 (when each of the second, seventh, and eighth transistors TR2, TR7, and TR8 includes a back gate electrode) are shifted according to the back bias control voltage VBB received by the corresponding back gate electrode. Thus, when the gate driving circuit 100 operates at a high temperature for a long period of time to negative-shift the threshold voltage of the second output transistor TR2, the threshold voltage may return to the normal range. Thus, the reliability of the gate driving circuit 100 may be improved.

Figure 12:
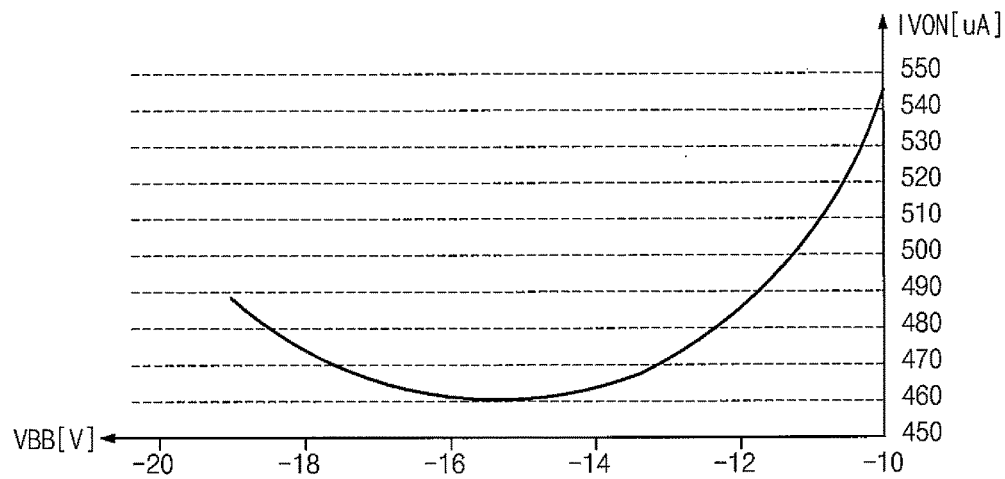
FIG. 12 is a view illustrating an example of a variation in current of a voltage output terminal of FIG. 9 according to a voltage provided to the back gate electrode of the second output transistor of FIG. 6.

FIG. 12 is a view illustrating an example of a variation in current of the voltage output terminal of FIG. 9 according to a voltage provided to the back gate electrode of the second output transistor of FIG. 6.

Referring to FIGS. 6, 9, and 12, a current level of the voltage output terminal VOUT of the voltage generator 320 may vary according to the back bias control voltage VBB provided to the back gate electrode of the second output transistor TR2. The timing controller 311 may output the back bias control voltage VBB having the desired or optimum level, which is capable of minimizing or reducing the current level of the voltage output terminal VOUT to improve the reliability of the gate driving circuit 100.

Figure 13:
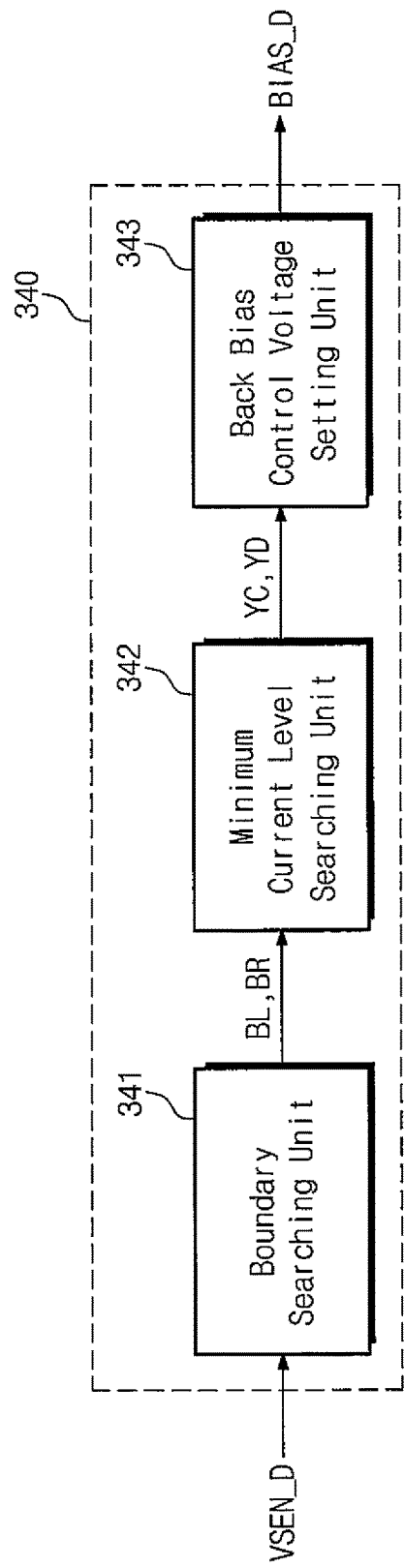
FIG. 13 is a block diagram illustrating an example of a back bias control unit included in a timing controller of FIG. 9.
Figure 14:
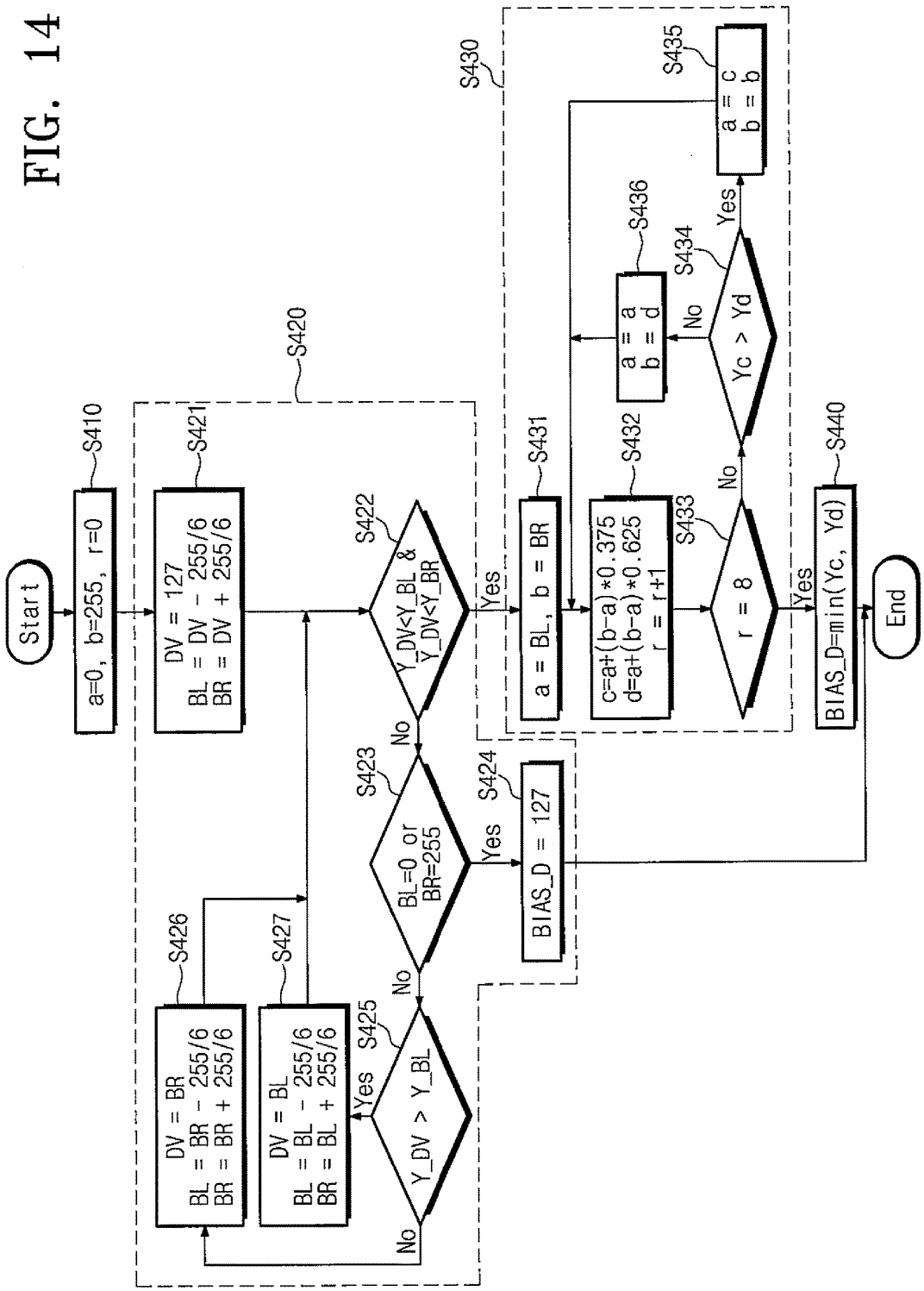
FIG. 14 is a flowchart illustrating an operation of the back bias control unit of FIG. 13.

FIG. 13 is a block diagram illustrating an example of a back bias control unit (e.g., a back bias controller) included in a timing controller of FIG. 9. FIG. 14 is a flowchart illustrating an operation of the back bias control unit of FIG. 13.

Referring to FIGS. 13 and 14, the back bias control unit 340 included in the timing controller 311 includes a boundary searching unit (e.g., a boundary searcher) 341, a minimum current level searching unit (e.g., a minimum current level searcher) 342, and a back bias control voltage setting unit (e.g., a back bias control voltage setter) 343. The boundary searching unit 341 sets variables a, b, and r that are used for operating the back bias control unit 340 (S410). The variables a and b denote a changing range of the back bias control voltage VBB, and the variable r denotes a minimum current level searching number.

When the digital detection signal VSEN_D corresponding to the current level of the voltage output terminal VOUT is greater than the reference level, the boundary searching unit 341 searches for a first boundary voltage BL and for a second boundary voltage BR, which are capable of minimizing or reducing the consumption current level of the voltage output terminal VOUT, while changing the back bias control voltage VBB by a first voltage level from a default voltage level (S420).

The minimum current level searching unit 342 searches for a first minimum current level IL and for a second minimum current level IR, which are capable of minimizing or reducing the consumption current level of the voltage output terminal VOUT, while changing the back bias control voltage VBB by a second voltage level between the first and second boundary voltages BL and BR (S430).

The back bias control voltage setting unit 343 outputs the bias voltage signal BIAS_D for setting a voltage corresponding to a relatively low current level of first and second minimum current levels Yc and Yd as the back bias control voltage VBB.

Figure 15:
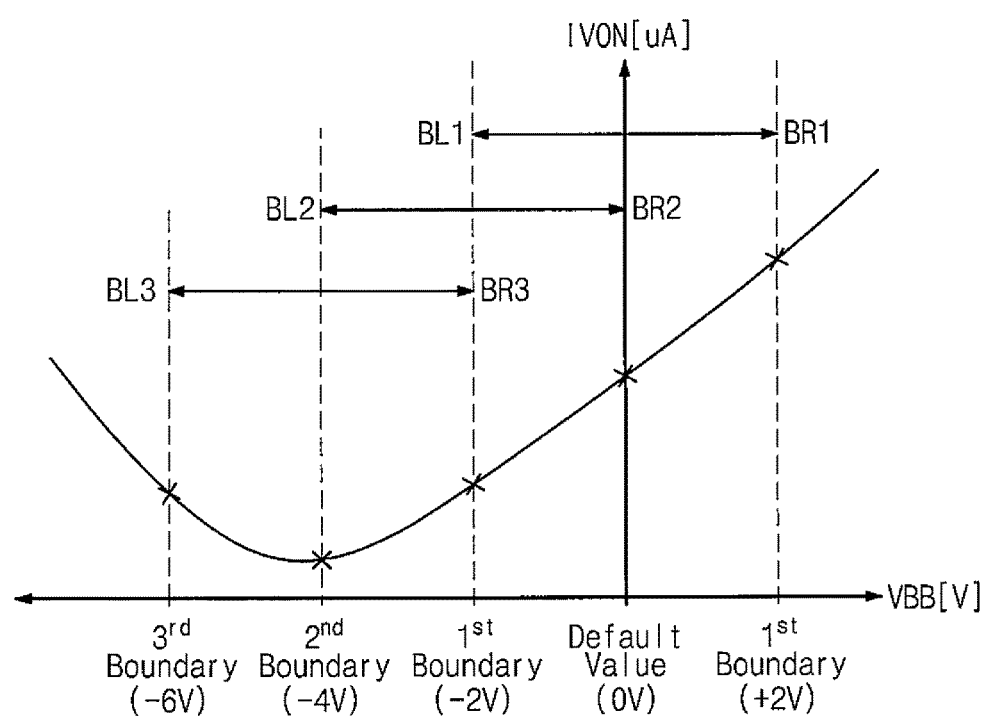
FIG. 15 is a graph illustrating a boundary searching operation illustrated in FIG. 14.

FIG. 15 is a view illustrating a boundary searching operation illustrated in FIG. 14.

Referring to FIGS. 13, 14, and 15, the boundary searching unit 341 sets the default voltage level DV to a level of about 127, and sets an initial value of each of the first and second boundary voltages BL and BR (S421). For example, assuming that a searching range of the back bias control voltage VBB (e.g., a maximum voltage and a minimum voltage) are about +6 V and about −6 V, respectively, the boundary searching unit 341 may divide a voltage of about 12 V (e.g., a voltage difference between the maximum voltage and the minimum voltage) into 255 sections, and may search for an optimum or desired back bias control voltage VBB corresponding to the minimum current level, while changing the voltage level in stages up to a voltage range of about −6 V to about +6 V. The initial value of the first boundary voltage BL is set to a voltage level that is reduced by a 255/6 stage from the default voltage DV. The initial value of the second boundary voltage BR is set to a voltage level that is increased by the 255/6 stage from the default voltage DV. In the example described with reference to FIG. 15, the default voltage level is about 0 V, the initial value of the first boundary voltage BL is BL1=−2 V, and the initial value of the second boundary voltage BR is BR1=+2 V.

In the embodiment described with reference to FIG. 13, the boundary searching unit 341 searches for the first and second boundary voltages BL and BR, which define the searching range to search for the optimum or desired back bias control voltage VBB during a short time.

In the graph of FIG. 15, the detection current IVON is represented by the Y-axis, and the back bias control voltage VBB is represented by the X-axis. When a voltage level of the first boundary voltage Y_BL is higher than a current level Y_DV of the default voltage level DV, and a voltage level of the second boundary voltage Y_BR is higher than a current level Y_DV of the default voltage level DV, the boundary searching operation of the boundary searching unit 341 is ended (S422).

When the voltage level of the first boundary voltage Y_BL is less than the current level Y_DV of the default voltage level DV, or the voltage level of the second boundary voltage Y_BR is less than the current level Y_DV of the default voltage level DV, the boundary searching unit 341 performs the next operation.

When the first boundary voltage BL is equal to zero, or the second boundary voltage BR reaches a voltage corresponding to 255 (S423), the boundary searching unit 341 determines that it is unable to perform the boundary searching. The boundary searching unit 341 outputs the bias voltage signal BIAS_D corresponding to the initial default voltage level 127 (S424) to end the boundary searching operation (S422).

When the first boundary voltage BL is not equal to zero, and the second boundary voltage BR is not equal to 255, the current level Y_DV corresponding to the default voltage level DV and the current level Y_BL corresponding to the first boundary voltage BL are compared with each other (S425).

If the current level Y_DV corresponding to the default voltage level DV is higher than the current level Y_BL corresponding to the first boundary voltage BL, the default voltage level DV is changed to the former first boundary voltage (BL=BL1). The first boundary voltage BL is changed to a voltage level that is decreased by the 255/6 stage from the former first boundary voltage BL1. The second boundary voltage BR is changed to a voltage level that is increased by the 255/6 stage from the former first boundary voltage BL1. In the example described with reference to FIG. 15, the first boundary voltage BL is set as BL2=−4 V, and the second boundary voltage BR is set as BR2=0 V.

If the current level Y_BL corresponding to the first boundary voltage BL is higher than the current level Y_DV corresponding to the default voltage level DV, the default voltage level DV is changed to the second boundary voltage BR. The first boundary voltage BL is changed to a voltage level that is decreased by the 255/6 stage from the former second boundary voltage BR1. The second boundary voltage BR is changed to a voltage level that is increased by the 255/6 stage from the former second boundary voltage BR1 (S426).

The boundary searching unit 341 repeatedly performs the operations S422, S423, S425, and S427. If the first boundary voltage BL reaches a voltage BL3, and the second boundary voltage BR reaches a voltage BR3, when the voltage level of the first boundary voltage BL is higher than the current level YDV of the default voltage level DV, and the voltage level of the second boundary voltage BR is higher than the current level Y_DV of the default voltage level DV, the boundary searching operation of the boundary searching unit 341 is ended (S422).

Figure 16:
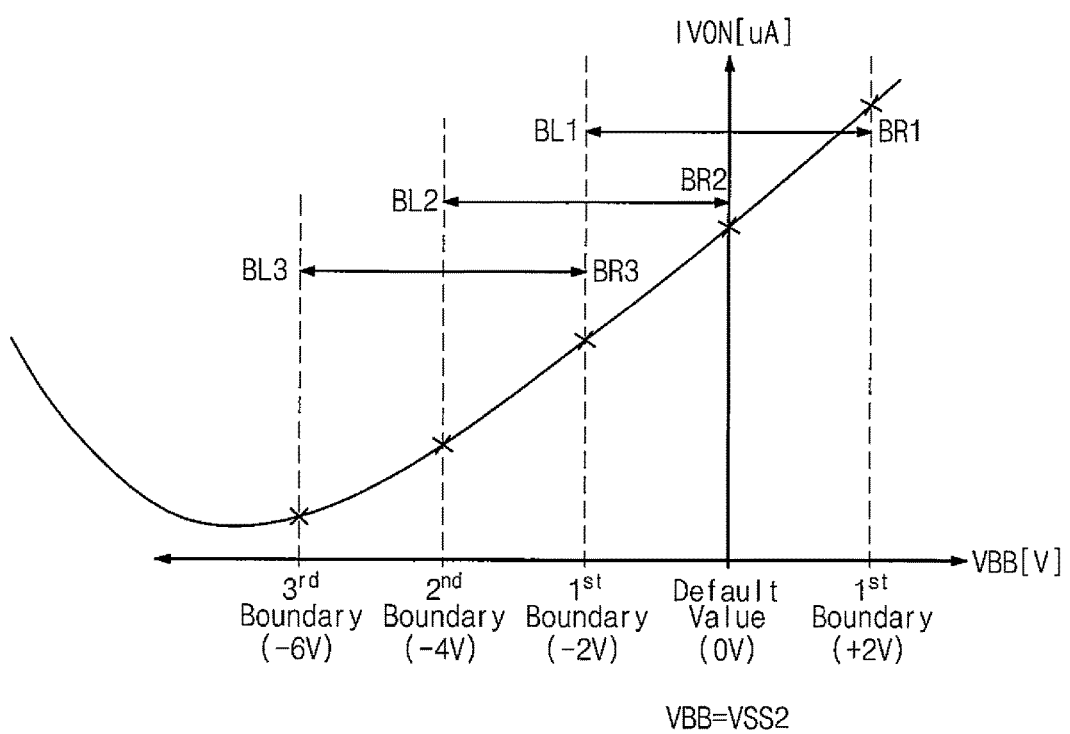
FIG. 16 is a graph illustrating an example of a case in which a boundary searcher of FIG. 13 determines that boundary searching is unsuccessful.

FIG. 16 is a view illustrating an example of a case in which a boundary searcher of FIG. 13 determines that boundary searching is unsuccessful.

Referring to FIGS. 13, 14, and 16, the boundary searching unit 341 may repeatedly perform the operations S422, S423, S425, and S427. Then, when the first boundary voltage BL reaches zero corresponding to the minimum voltage (BL3=−6 V), the boundary searching unit 341 determines that the boundary searching is unsuccessful. The boundary searching unit 341 outputs the default voltage level (127=0 V) as the bias voltage signal BIAS_D to end the boundary searching operation.

Figure 17:
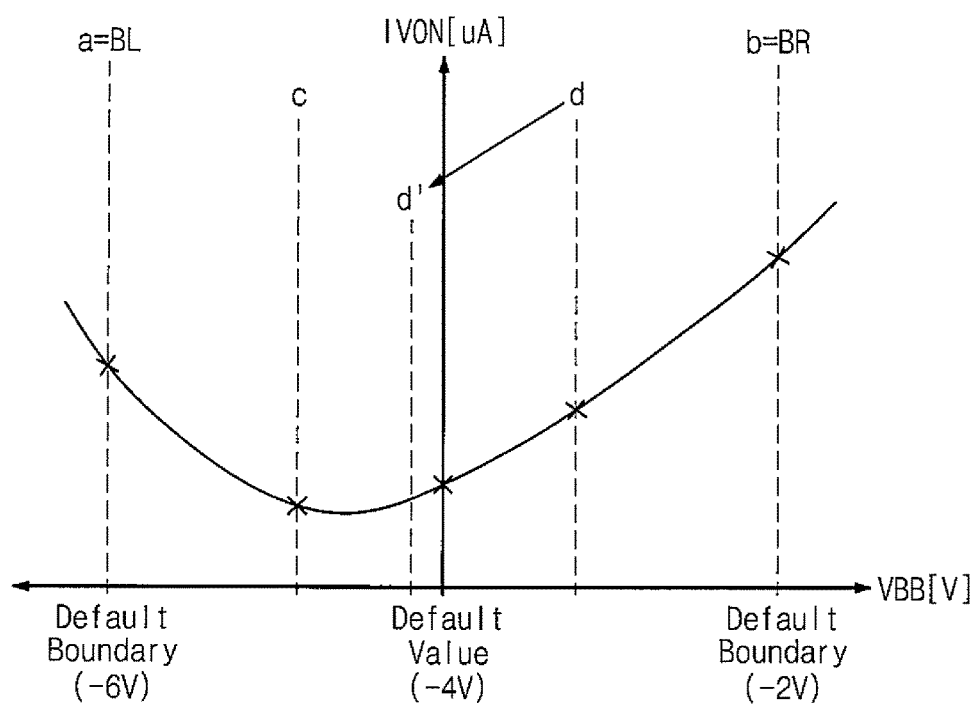
FIG. 17 is a graph illustrating an operation of a minimum current level searcher of FIG. 13.

FIG. 17 is a view illustrating an operation of a minimum current level searching unit (e.g., a minimum current level searcher) 342 of FIG. 13.

Referring to FIGS. 13, 14, and 17, the minimum current level searching unit 342 sets the first and second boundary voltages BL and BR, which are set by the boundary searching unit 341 as first and second searching voltages a and b (S431). The minimum current level searching unit 342 sets third and fourth searching voltages c and d based on the first and second searching voltages a and b (S432). The third searching voltage c may be the next changing voltage of the first searching voltage a.

The fourth searching voltage d may be the next changing voltage of the second searching voltage b.

The minimum current level searching unit 342 repeatedly performs a minimum current searching operation up to r (e.g., r=8) times (S433). However, the inventive concept is not limited thereto, and the number of repeated searching operations r may be changed to any suitable number.

Initially, the first searching voltage a is set as the first boundary voltage, and the second searching voltage b is set as the second boundary voltage. The minimum current level searching unit 342 compares current Yc corresponding to the third searching voltage c to current Yd corresponding to the fourth searching voltage d (S434).

When the current Yd corresponding to the fourth searching voltage d has a level that is higher than that of the current Yc corresponding to the third searching voltage c, the first searching voltage a is maintained or substantially maintained as is (a=a), and the second searching voltage b is changed to the fourth searching voltage d (b=d) (S436).

The minimum current level searching unit 342 newly calculates third and fourth searching voltages c and d based on the changed first and second searching voltages a and b (d=d') (S432).

When the current Yd corresponding to the fourth searching voltage (d=d') has a level that is higher than that of the current Yc corresponding to the third searching voltage c, the first searching voltage a is maintained or substantially maintained as is (a=a), and the second searching voltage b is changed to the fourth searching voltage d (S436).

When the current Yc corresponding to the third searching voltage c has a level that is higher than that the current Yd corresponding to the fourth searching voltage d, the first searching voltage a is changed to the third searching voltage c (a=c), and the second searching voltage b is maintained or substantially maintained as is (b=b) (S435).

The minimum current level searching process as described above may be repeated up to r=8 times. Here, the repeated number r is equal to 8, and the searching process is ended (S440).

Figure 18:
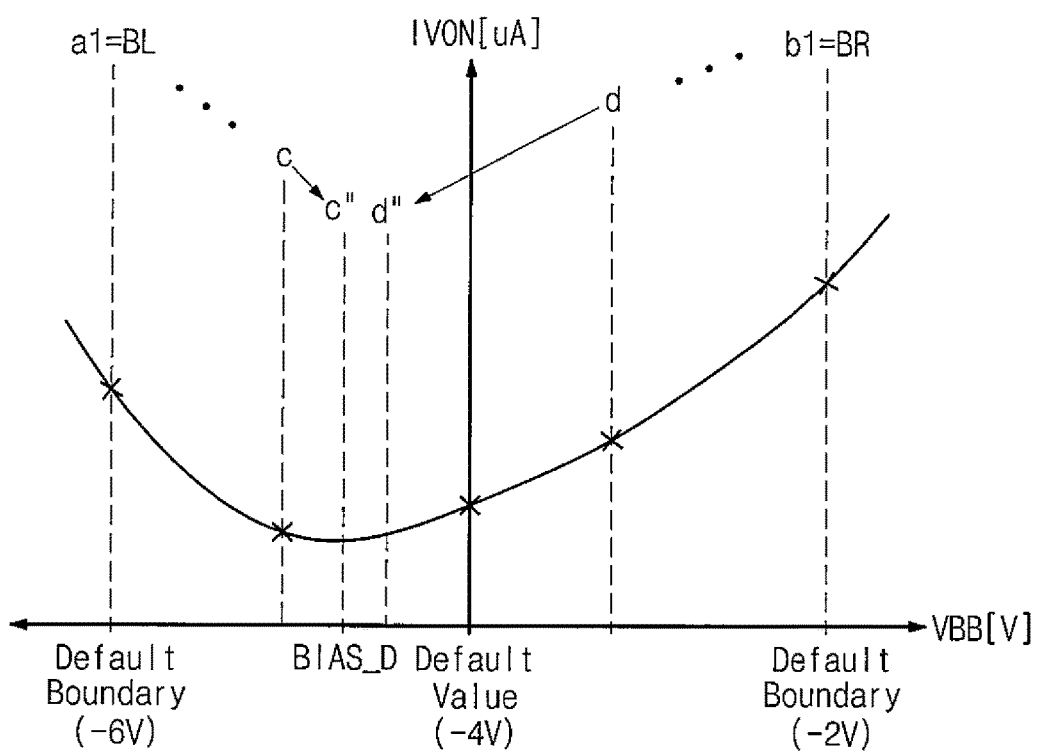
FIG. 18 is a graph illustrating an operation of a back bias control voltage setting unit of FIG. 13.

FIG. 18 is a view illustrating an operation of the back bias control voltage setting unit of FIG. 13.

Referring to FIGS. 13, 14, and 18, the back bias control voltage setting unit 343 compares the current Yc corresponding to the third searching voltage (c=c") provided from the minimum current level searching unit 342 with the current Yd corresponding to the fourth searching voltage (d=d"). The back bias control voltage setting unit 343 selects a voltage corresponding to the current Yc having a relatively low level of the current Yc and Yd as the bias voltage signal BIAS_D.

The boundary searching unit 341 included in the back bias selection unit 160 searches for the first and second boundary voltages BL and BR up to, for example, three times. The minimum current level searching unit 342 searches for the third and fourth searching voltages c and d up to, for example, eight times. Thus, the back bias control voltage VBB that is capable of minimizing or reducing the consumption current level of the voltage output terminal VOUT may be searched and set up to, for example, eleventh times.

Figure 19:
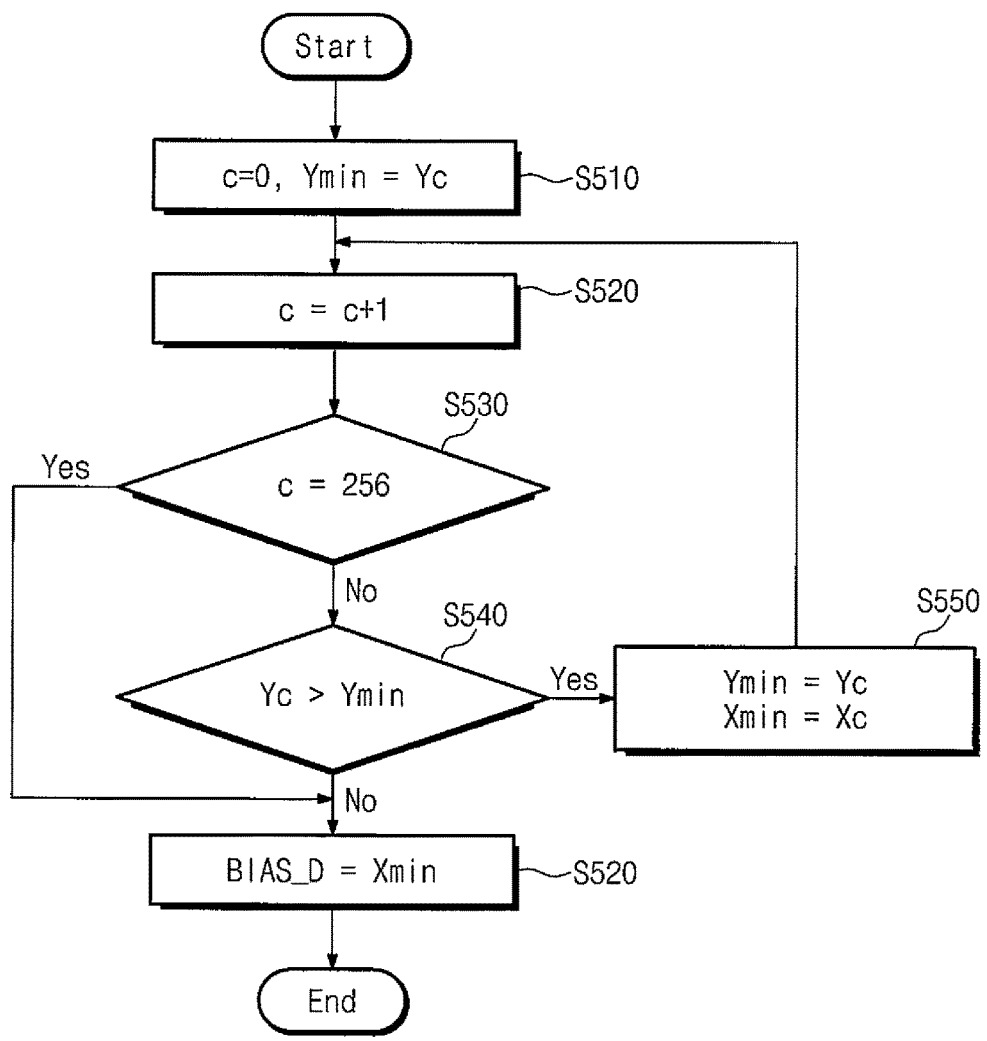
FIG. 19 is a flowchart illustrating an operation of a back bias control unit included in a timing controller of FIG. 1 according to another embodiment of the inventive concept.

FIG. 19 is a flowchart illustrating an operation of a back bias control unit (e.g., a back bias controller) included in a timing controller of FIG. 1 according to another embodiment of the inventive concept.

Referring to FIGS. 9 and 19, a back bias control unit (e.g., a back bias controller) 340 sets a count value c, and sets an initial value of minimum current Ymin (S510). The back bias control unit 340 counts up the count value c by one value (S520). When the count value c is not equal to 256, the back bias control unit 340 performs the next operation (S530).

The back bias control unit 340 compares the current Yc corresponding to the present count value c with the minimum current Ymin (S540). When the current Yc has a level that is higher than that of the minimum current Ymin, the minimum current Ymin is changed to the current Yc corresponding to the present count value c, and a minimum voltage Xmin is set as a voltage corresponding to the present count value c (S550).

When the minimum current Ymin has a level that is higher than that of the current Yc, while the current comparison processes S520, S530, S540, and S550 are repeatedly performed, the back bias control unit 340 sets the minimum voltage Xmin as the bias voltage signal BIAS_D (S520).

If the minimum voltage that is capable of minimizing or reducing the consumption current level of the output terminal VOUT is not searched, even though the count value c reaches 256, the last minimum voltage Xmin is set as the bias voltage signal BIAS_D (S520).

As described in FIG. 12, when the back bias control voltage VBB is changed from the low voltage level to the high voltage level (or from the high voltage level to the low voltage level), it is seen that the consumption current level of the output terminal VOUT is changed in a curved shape in which the consumption current level decreases and then increases.

Thus, when a voltage at a time point at which the current Yc is changed from a level that is higher than that of the minimum current Ymin to a level that is lower than that of the minimum current Ymin is set as the back bias control voltage VBB, the consumption current level of the voltage output terminal VOUT may be minimized or reduced.

Figure 20:
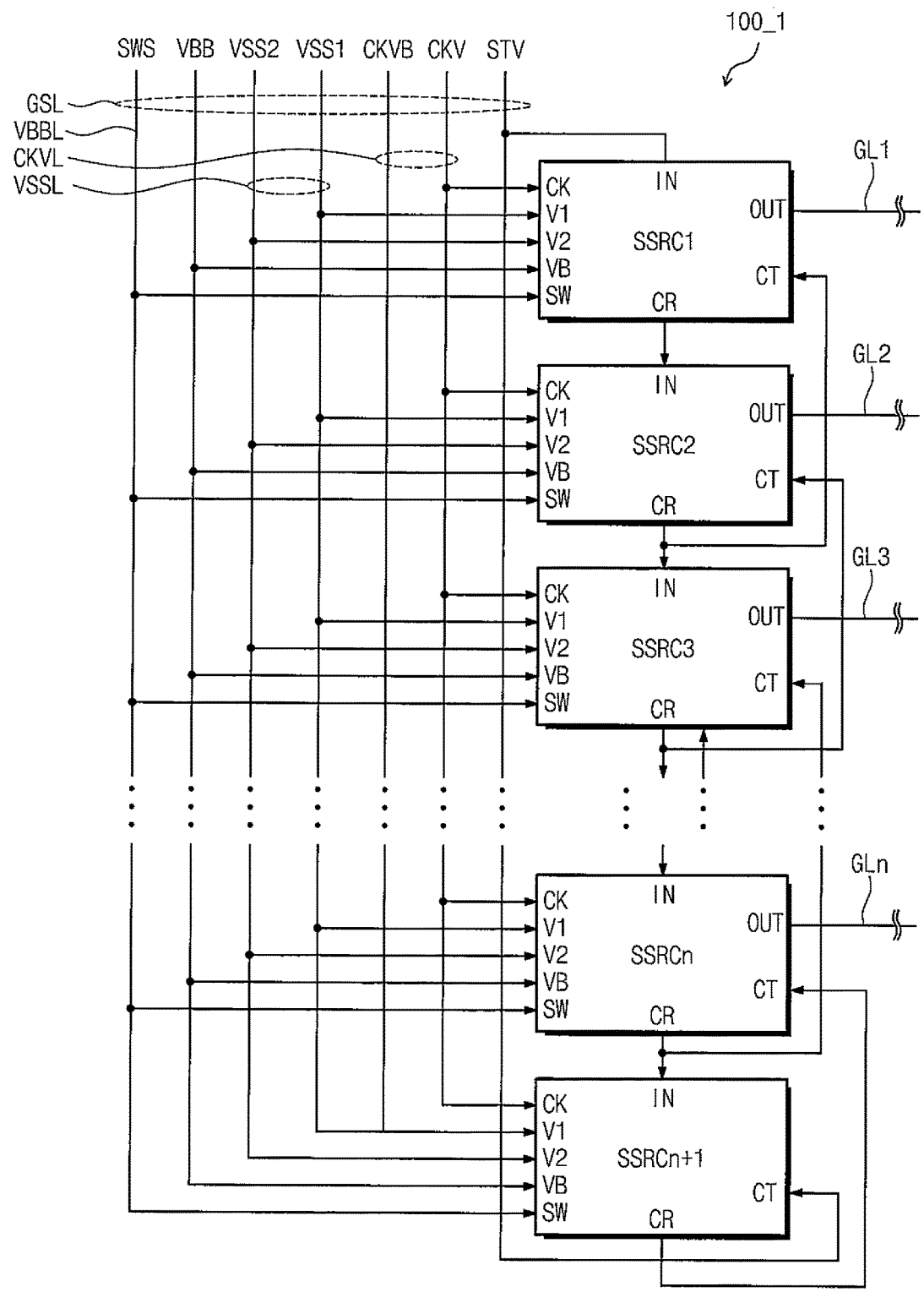
FIG. 20 is a block diagram of a gate driving circuit according to another embodiment of the inventive concept.

FIG. 20 is a block diagram of a gate driving circuit according to another embodiment of the inventive concept.

A gate driving circuit 100_1 of FIG. 20 has the same or substantially the same structure as that of the gate driving circuit 100 of FIG. 5. However, the gate driving circuit 100_1 further receives a switching signal SWS. The switching signal SWS may be provided from the timing controller 311 of FIG. 9. Each of a plurality of driving stages SSRC1 to SSRCn and a dummy driving stage SSRCn+1 may further include a switching terminal SW for receiving the switching signal SWS.

Figure 21:
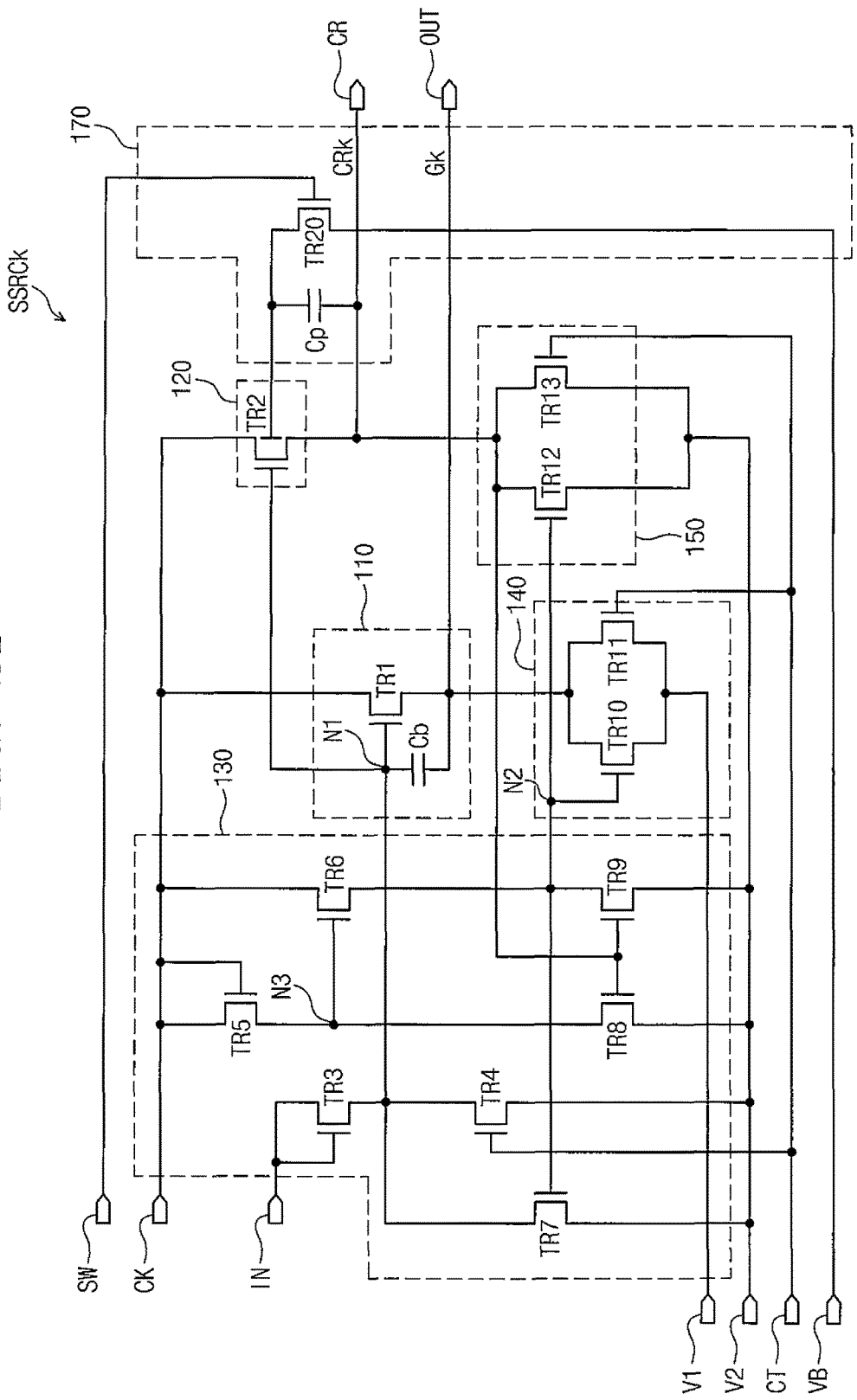
FIG. 21 is a circuit diagram of a driving stage of FIG. 20.

FIG. 21 is a circuit diagram of a driving stage of FIG. 20. FIG. 21 illustrates an example of a k-th driving stage SSRCk (where k is positive integer) of the plurality of driving stages SSRC1 to SSRCn of FIG. 20. Each of the driving stages SSRC1 to SSRCn of FIG. 20 may have the same or substantially the same circuit configuration as that of the k-th driving stage SSRCk.

Referring to FIG. 21, the k-th driving stage SSRCk includes a first output unit (e.g., a first output portion or a first output circuit portion) 110, a second output unit (e.g., a second output portion or a second output circuit portion) 120, a control unit (e.g., a control portion or a control circuit portion) 130, a first pull-down unit (e.g., a first pull-down portion or a first pull-down circuit portion) 140, a second pull-down unit (e.g., a second pull-down portion or a second pull-down circuit portion) 150, and a back bias selection unit (e.g., a back bias selection portion or a back bias selection circuit portion) 170.

Since the first output unit 110, the second output unit 120, the control unit 130, the first pull-down unit 140, and the second pull-down unit 150 have the same or substantially the same structure as those of FIG. 6, the same reference numbers are provided, and also, duplicate descriptions thereof will be omitted.

The back bias selection unit 170 includes a transistor TR20 and a capacitor Cp. The transistor TR20 is connected between a bias terminal VB and the back gate electrode of the second output transistor TR2, and includes a control electrode connected to the switching terminal SW. The capacitor Cp is connected to the back gate electrode of the second output transistor TR2 and the second electrode of the second output transistor TR2. The transistor TR20 provides a back bias control voltage VBB received from a back bias terminal VB to the back gate electrode of the second output transistor TR2. The switching signal SWS provided from the timing controller 311 of FIG. 9 may be a signal that is activated with a high level for a set or predetermined time during a horizontal blank period.

Thus, the back bias control voltage VBB is provided to the back gate electrode of the second output transistor TR2 during the horizontal blank period. A constant voltage may be maintained or substantially maintained between the second output transistor TR2 and the back gate electrode by charges charged in the capacitor Cp during a rest period.

Figure 22:
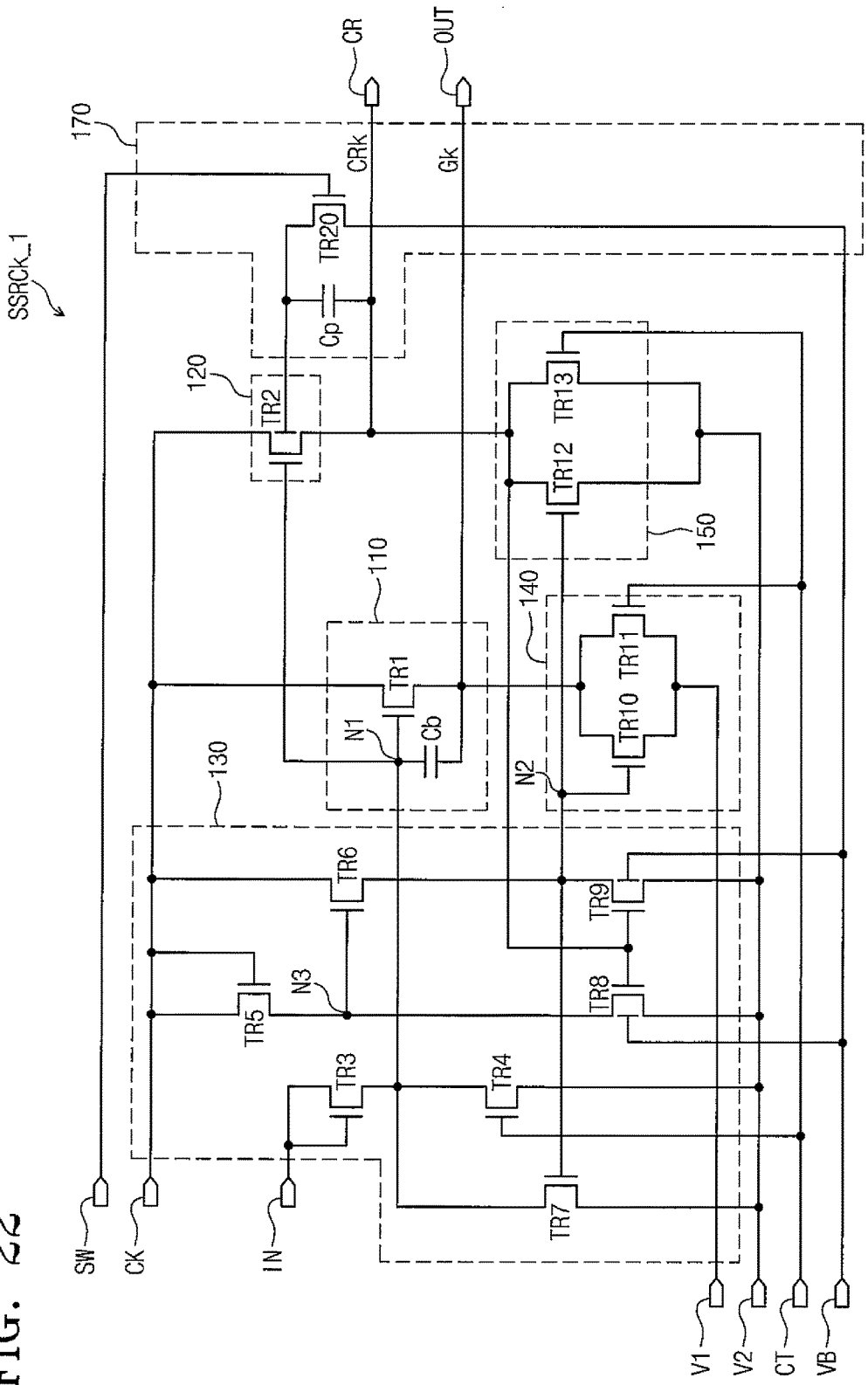
FIG. 22 is a circuit diagram of the driving stage of FIG. 20 according to another embodiment of the inventive concept.

FIG. 22 is a circuit diagram of the driving stage of FIG. 20 according to another embodiment of the inventive concept.

FIG. 22 illustrates a modified driving stage SSRCk_1 of the k-th driving stage SSRCk (where k is positive integer) of the plurality of driving stages SSRC1 to SSRCn of FIG. 20. Each of the driving stages SSRC1 to SSRCn of FIG. 20 may have the same or substantially the same circuit configuration as that of the k-th driving stage SSRCk_1.

Referring to FIG. 22, the modified k-th driving stage SSRCk_1 includes a first output unit (e.g., a first output portion or a first output circuit portion) 110, a second output unit (e.g., a second output portion or a second output circuit portion) 120, a control unit (e.g., a control portion or a control circuit portion) 130, a first pull-down unit (e.g., a first pull-down portion or a first pull-down circuit portion) 140, a second pull-down unit (e.g., a second pull-down portion or a second pull-down circuit portion) 150, and a back bias selection unit (e.g., a back bias selection portion or a back bias selection circuit portion) 170. Since the modified k-th driving stage SSRCk_1 has the same or substantially the same structure as that of the k-th driving stage SSRCk of FIG. 21, duplicate description thereof will be omitted.

An eighth transistor TR8 and a ninth transistor TR9 of the control unit 130 may be each a four-terminal transistor in which a threshold voltage is adjustable, like that of the second output transistor TR2. A back bias control voltage VBB received from a back bias terminal VB may be provided to back gate electrodes of the eighth transistor TR8 and the ninth transistor TR9. A threshold voltage of each of the eighth transistor TR8 and the ninth transistor TR9 may be adjusted according to the back bias control voltage VBB to improve reliability of the gate driving circuit.

The display device including the above-described constituents, according to one or more aspects of example embodiments of the inventive concept, may adjust the back bias voltage level that is provided to the back gate electrode of the transistor when the threshold voltage of the transistor provided in the gate driving circuit is shifted. Since the threshold voltage of the transistor is set to the desired level by adjusting the back bias voltage level provided to the back gate electrode thereof, the reliability of the gate driving circuit may be improved. Further, the optimum or desired back bias voltage level may be set within a short or a shortest time to minimize or reduce current consumption in the gate driving circuit.

Example embodiments have been described with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the inventive concept described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

From the foregoing, it will be appreciated that various embodiments in accordance with the inventive concept have been described herein for purposes of illustration, and that various modifications may be made thereof without departing from the spirit and scope of the present invention. Accordingly, descriptions of aspects or features within each example embodiment should typically be considered as available for other similar aspects or features in other example embodiments. Further, the various embodiments disclosed herein are not intended to be limiting of the spirit and scope of the present invention, as defined in the following claims, and their equivalents.

What is claimed is:

1. A display device comprising:
    a display panel comprising a plurality of pixels respectively connected to a plurality of gate lines;
    a voltage generator configured to output a gate on voltage to a voltage output terminal;
    a clock generator configured to receive the gate on voltage to generate at least one clock signal;
    a gate driving circuit comprising a plurality of driving stages configured to output gate signals to the plurality of gate lines in response to the at least one clock signal; and
    a signal controller configured to detect a current variation of the voltage output terminal to output a back bias control voltage when the detected current variation is greater than a reference level,
    wherein each of the plurality of driving stages comprises at least one transistor configured to adjust a threshold voltage based on the back bias control voltage, and
    wherein the signal controller comprises a back bias controller configured to search for the back bias control voltage that is capable of minimizing a consumption current level of the voltage output terminal while changing the back bias control voltage by a set level from a default voltage level when the detected current variation is greater than the reference level.

2. The display device of claim 1, wherein the back bias controller comprises:
    a boundary searcher configured to search for first and second boundary voltages that are capable of minimizing the consumption current level of the voltage output terminal while changing the back bias control voltage by a first voltage level from the default voltage level when the detected current variation is greater than the reference level;
    a minimum current level searcher configured to search for first and second minimum current levels that are capable of minimizing the consumption current level of the voltage output terminal while changing the back bias control voltage by a second voltage level between the first and second boundary voltages; and
    a back bias control voltage setter configured to output a voltage corresponding to a relatively low current level of the first and second minimum current levels as the back bias control voltage.

3. The display device of claim 2, wherein the first voltage level is greater than the second voltage level.

4. The display device of claim 1, wherein the clock generator is configured to provide at least one low voltage to the gate driving circuit.

5. The display device of claim 4, wherein the gate driving circuit comprises:
    a back bias voltage signal line configured to transmit the back bias control voltage to each of the plurality of stages;
    a clock signal line configured to transmit the at least one clock signal to each of the plurality of stages; and
    a low voltage line configured to transmit the at least one low voltage to each of the plurality of stages.

6. The display device of claim 5, wherein the plurality of stages are configured to output the gate signals in response to the back bias control voltage, the at least one clock signal, and the at least one low voltage.

7. The display device of claim 6, wherein a k-th stage (where k is natural number greater than 2) of the plurality of stages comprises:
    a first output transistor comprising a control electrode configured to receive an output control signal from a first node, an input electrode configured to receive the at least one clock signal, and an output electrode configured to output a k-th gate signal;
    a second output transistor comprising a control electrode configured to receive the output control signal from the first node, an input electrode configured to receive the at least one clock signal, and an output electrode configured to output a k-th carry signal; and
    a control portion configured to output the output control signal to the first node in response to the at least one clock signal, to output a (k−1)-th carry signal outputted from a (k−1)-th stage, and to output a (k+1)-th carry signal outputted from a (k−1)-th stage.

8. The display device of claim 7, wherein at least one of the first and second output transistors comprises a four-terminal transistor comprising a first electrode, a second electrode, a gate electrode, and a back gate electrode connected to a source of the back bias control voltage.

9. The display device of claim 8, wherein each of the plurality of driving stages further comprises a back bias selection portion configured to provide the at least one clock signal to the back gate electrode of the four-terminal transistor when a gate signal having an activated level is outputted to a corresponding gate line, and configured to provide the back bias control voltage to the back gate electrode of the four-terminal transistor when the gate signal having an non-activated level is outputted.

10. The display device of claim 9, wherein the back bias selection portion comprises:
a first control transistor comprising a first electrode connected to a source of the at least one clock signal, a second electrode connected to the back gate electrode of the four-terminal transistor, and a gate electrode connected to the first node;
a second control transistor comprising a first electrode connected to the back gate electrode of the four-terminal transistor, a second electrode connected to the source of the back bias control voltage, and a gate electrode connected to a source of an inversion signal of the k-th carry signal; and
a capacitor connected between the back gate electrode of the four-terminal transistor and a source of the at least one low voltage.

11. The display device of claim 8, wherein the signal controller is further configured to output a switching signal, and
each of the plurality of driving stages further comprises a back bias selection portion configured to provide the back bias control voltage to the back gate electrode of the four-terminal transistor when the switching signal is activated.

12. The display device of claim 11, wherein the back bias selection portion comprises:
a control transistor comprising a first electrode connected to the source of the back bias control voltage, a second electrode connected to the back gate electrode of the four-terminal transistor, and a control electrode connected to a source of the switching signal; and
a capacitor connected between the back gate electrode of the four-terminal transistor and the second electrode of the four-terminal transistor.

13. A display device comprising:
a display panel comprising a plurality of pixels respectively connected to a plurality of gate lines;
a voltage generator configured to output a gate on voltage to a voltage output terminal;
a clock generator configured to receive the gate on voltage to generate at least one clock signal;
a gate driving circuit comprising a plurality of driving stages configured to output gate signals to the plurality of gate lines in response to the at least one clock signal; and
a signal controller configured to detect a current variation of the voltage output terminal to output a back bias control voltage when the detected current variation is greater than a reference level,
wherein each of the plurality of driving stages comprises:
at least one transistor comprising a back gate electrode configured to adjust a threshold voltage according to the back bias control voltage provided to the back gate electrode; and
a back bias selection portion configured to provide a first signal to the back gate electrode when a gate signal having an activated level is outputted to a corresponding gate line, and configured to provide the back bias control voltage to the back gate electrode when the gate signal having an non-activated level is outputted.

14. The display device of claim 13, wherein the at least one transistor comprises a four-terminal transistor comprising a first electrode, a second electrode, a gate electrode, and the back gate electrode.

15. The display device of claim 13, wherein the back bias selection portion comprises:
a first control transistor comprising a first electrode connected to a source of the at least one clock signal, a second electrode connected to the back gate electrode of the at least one transistor, and a gate electrode connected to a first node;
a second control transistor comprising a first electrode connected to the back gate electrode of the at least one transistor, a second electrode connected to a source of the back bias control voltage, and a gate electrode connected to a source of an inversion signal of a k-th carry signal; and
a capacitor connected between the back gate electrode of the at least one transistor and a source of at least one low voltage.

16. The display device of claim 13, wherein the signal controller is further configured to output a switching signal,
the back bias selection portion is configured to provide the back bias control voltage to the back gate electrode of the at least one transistor when the switching signal is activated, and
the back bias selection portion comprises:
a control transistor comprising a first electrode connected to a source of the back bias control voltage, a second electrode connected to the back gate electrode of the at least one transistor, and a control electrode connected to a source of the switching signal; and
a capacitor connected between the back gate electrode of the at least one transistor and the second electrode of the at least one transistor.

17. A method for driving a display device comprising a display panel comprising a plurality of pixels respectively connected to a plurality of gate lines, and a gate driving circuit comprising a plurality of driving stages configured to output gate signals to the plurality of gate lines, the method comprising:
generating a gate on voltage to output the gate on voltage to a voltage output terminal;
generating at least one clock signal according to the gate on voltage;
driving the plurality of gate lines by utilizing the plurality of driving stages in response to the at least one clock signal;
detecting a current variation of the voltage output terminal; and
searching for a back bias control voltage that is capable of minimizing a consumption current level of the voltage output terminal while changing the back bias control voltage by a set level from a default voltage level when the detected current variation is greater than a reference level; and outputting the back bias control voltage,
wherein each of the plurality of driving stages comprises at least one transistor configured to adjust a threshold voltage according to the back bias control voltage.

18. The method of claim 17, wherein the outputting of the back bias control voltage comprises:
searching for first and second boundary voltages that are capable of minimizing consumption current level of the voltage output terminal while changing the back bias control voltage by a first voltage level from the default voltage level when the detected current variation is greater than the reference level;
searching for first and second minimum current levels that are capable of minimizing the consumption current level of the voltage output terminal while changing the back bias control voltage by a second voltage level between the first and second boundary voltages; and
outputting a voltage corresponding to a relatively low current level of the first and second minimum current levels as the back bias control voltage.

19. The method of claim 18, wherein the first voltage level is greater than the second voltage level.

20. The method of claim 17, wherein the at least one transistor comprises a four-terminal transistor comprising a first electrode, a second electrode, a gate electrode, and a back gate electrode connected to a source of the back bias control voltage.

* * * * *